(12) United States Patent
Jiroku et al.

(10) Patent No.: US 6,602,765 B2
(45) Date of Patent: Aug. 5, 2003

(54) FABRICATION METHOD OF THIN-FILM SEMICONDUCTOR DEVICE

(75) Inventors: Hiroaki Jiroku, Suwa (JP); Mitsutoshi Miyasaka, Suwa (JP); Hidetada Tokioka, Tokyo (JP); Tetsuya Ogawa, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 44 days.

(21) Appl. No.: 09/875,910

(22) Filed: Jun. 8, 2001

(65) Prior Publication Data

US 2002/0052069 A1 May 2, 2002

(30) Foreign Application Priority Data

Jun. 12, 2000 (JP) ........................................ 2000-175789

(51) Int. Cl.⁷ .......................... H01L 21/20; H01L 21/00
(52) U.S. Cl. ........................ 438/487; 438/486; 438/151; 438/166
(58) Field of Search ................................ 438/486, 487, 438/150, 149, 308, 166, 151

(56) References Cited

U.S. PATENT DOCUMENTS

| | | | | |
|---|---|---|---|---|
| 4,466,179 A | * | 8/1984 | Kasten .......................... 438/488 |
| 4,751,193 A | * | 6/1988 | Myrick .......................... 117/44 |
| 4,820,011 A | * | 4/1989 | Umegaki et al. ............... 385/37 |
| 4,822,851 A | * | 4/1989 | Stober et al. ................... 525/61 |
| 4,838,638 A | * | 6/1989 | Kamiyama et al. ........... 385/122 |
| 4,984,033 A | * | 1/1991 | Ishizu et al. ................... 257/98 |
| 4,986,214 A | * | 1/1991 | Zumoto et al. ............... 118/722 |
| 5,066,291 A | * | 11/1991 | Stewart .......................... 606/3 |
| 5,145,808 A | * | 9/1992 | Sameshima et al. .......... 117/44 |
| 5,219,786 A | * | 6/1993 | Noguchi .......................... 438/5 |
| 5,265,114 A | * | 11/1993 | Sun et al. ....................... 372/69 |
| 5,314,831 A | * | 5/1994 | Hirae et al. ................... 356/30 |
| 5,365,875 A | * | 11/1994 | Asai et al. .................... 438/487 |
| 5,529,951 A | * | 6/1996 | Noguchi et al. .............. 438/487 |
| 5,569,398 A | * | 10/1996 | Sun et al. ............... 219/121.68 |
| 5,581,102 A | * | 12/1996 | Kusumoto .................... 257/347 |
| 5,591,668 A | * | 1/1997 | Maegawa et al. ............ 438/799 |
| 5,616,506 A | * | 4/1997 | Takemura .................... 438/150 |
| 5,771,110 A | * | 6/1998 | Hirano et al. .................. 257/72 |
| 5,773,309 A | * | 6/1998 | Weiner ........................ 438/166 |
| 5,808,318 A | * | 9/1998 | Masumo et al. ............... 257/66 |
| 5,960,323 A | * | 9/1999 | Wakita et al. ............... 438/795 |
| 5,966,193 A | * | 10/1999 | Zhang et al. ................. 349/110 |
| 6,002,697 A | * | 12/1999 | Govorkov et al. ............. 372/34 |
| 6,057,183 A | * | 5/2000 | Koyama et al. ............. 438/166 |
| 6,096,581 A | * | 8/2000 | Zhang et al. ................. 438/149 |
| 6,193,796 B1 | * | 2/2001 | Yang .............................. 117/4 |
| 6,233,380 B1 | * | 5/2001 | Ferrieu .......................... 385/30 |
| 6,391,395 B1 | * | 5/2002 | Tseng et al. ................. 427/574 |
| 6,451,636 B1 | * | 9/2002 | Segawa et al. .............. 438/166 |
| 6,452,241 B1 | * | 9/2002 | Fukata et al. ................ 257/435 |
| 6,462,806 B2 | * | 10/2002 | Zhang et al. ................. 349/199 |
| 6,480,244 B2 | * | 11/2002 | Murade et al. ................ 349/43 |
| 6,501,097 B1 | * | 12/2002 | Zhang .......................... 257/72 |
| 6,518,081 B2 | * | 2/2003 | Fukata et al. ................. 438/34 |
| 6,524,877 B1 | * | 2/2003 | Nakazawa et al. ............ 438/48 |

\* cited by examiner

*Primary Examiner*—Matthew Smith
*Assistant Examiner*—Lex H. Malsawma
(74) *Attorney, Agent, or Firm*—Oliff & Berridge PLC

(57) ABSTRACT

An object is to fabricate high quality thin-film semiconductor devices at comparatively low temperatures. After providing a local heating system, an active semiconductor layer is formed, and melt crystallization is promoted by irradiating a pulsed laser onto the active semiconductor layer.

36 Claims, 11 Drawing Sheets

IRRADIATION PROFILE ON THE SEMICONDUCTOR LAYER SURFACE

LASER INTENSITY DISTRIBUTION CORRESPONDING TO SECTION A-A' IN FIGURE ABOVE

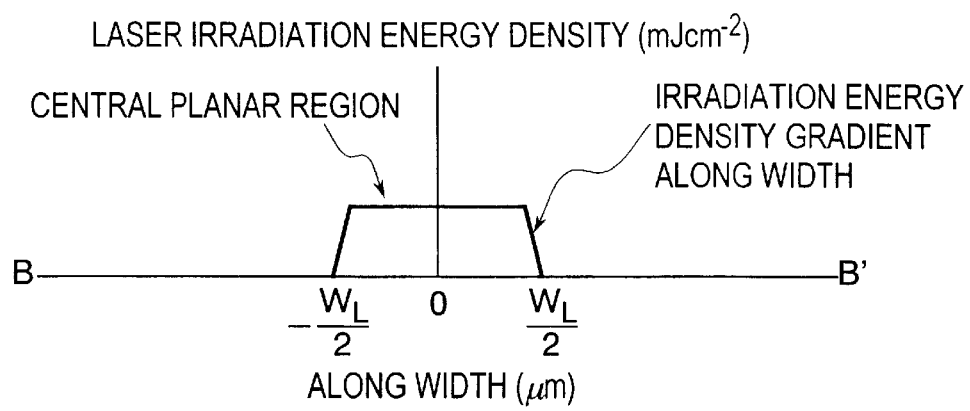
TRAPEZOIDAL LASER INTENSITY DISTRIBUTION ALONG SECTION B-B' OF FIG. 6
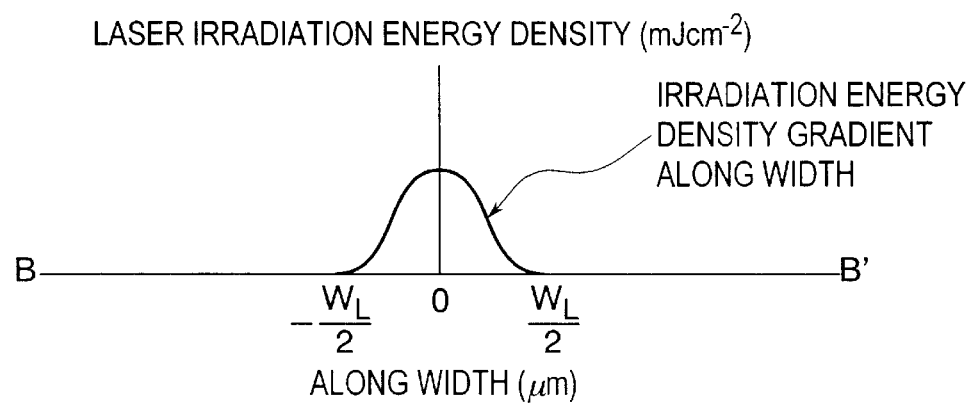
GAUSSIAN LASER INTENSITY DISTRIBUTION ALONG SECTION B-B' OF FIG. 6

TRAPEZOID LASER INTENSITY DISTRIBUTION ALONG SECTION B-B' OF FIG. 6

MT. FUJI-LIKE (TRAPEZOID WITH CONCAVE SIDES)
LASER INTENSITY DISTRIBUTION ALONG SECTION B-B' OF FIG. 6

FABRICATION METHOD OF THIN-FILM SEMICONDUCTOR DEVICE

BACKGROUND OF THE INVENTION

1. Field of the Invention

The present invention relates to a technology that improves the quality of crystalline semiconductor thin films formed on substrates and minimizes quality variations. In particular, the invention relates to a method for fabricating thin-film semiconductor devices using this technology, in which the performance of thin-film semiconductor devices, wherein a crystalline semiconductor film formed on a substrate is utilized as a semiconductor device channel formation region, is markedly improved, and also the quality of the semiconductor device components can be consistent.

2. Description of Related Art

Conventionally, a fabrication scheme such as that described below has been used when fabricating thin-film semiconductor devices such as polysilicon thin-film transistors (p-Si TFT) at low temperatures of approximately 600° C. or less, wherein general-purpose glass substrates can be used. First, an amorphous silicon layer serving as a semiconductor layer is deposited on the substrate to a thickness of approximately 50 nm by low-pressure chemical vapor deposition (LPCVD). This amorphous layer is then irradiated with a XeCl excimer laser (wavelength: 308 nm) to form a polysilicon film (p-Si film). Since the absorption coefficients of the XeCl excimer laser in the amorphous silicon and polysilicon are high (0.139 $nm^{-1}$ and 0.149 $nm^{-1}$ respectively), 90% of the laser light incident on the semiconductor film is absorbed at a depth of 15 nm or less from the surface. Next, a silicon oxide layer serving as a gate dielectric layer is formed by chemical vapor deposition (CVD) or by physical vapor deposition (PVD). Gate electrodes are then created using a material such as tantalum to form field effect transistors (MOSFET) consisting of a metal (gate), an oxide layer (gate dielectric layer) and a semiconductor (polysilicon layer). Finally, an interlevel dielectric layer is deposited on top of these layers and, after contact holes are opened, a thin-film of metal interconnects is patterned, completing the thin-film semiconductor device.

However, controlling the energy density of the excimer laser light used in the conventional method of fabricating these thin-film semiconductor devices was difficult, and even slight fluctuations in the energy density caused the semiconductor layer to exhibit significant non-uniformity, even within the same substrate. Moreover, if the irradiation energy density were even slightly higher than the threshold value determined by film thickness and hydrogen content, the semiconductor layer incurred extensive damage, inviting marked deterioration of semiconductor characteristics and product yield. Therefore, the energy density of the laser light had to be set considerably lower than the optimum value to obtain a uniform polycrystalline semiconductor layer. For this reason, obtaining high quality polycrystalline thin films meant that an insufficient energy density could not be avoided. Furthermore, enlarging the grains that comprise the polycrystalline layer was difficult even if the laser was radiated at the optimum energy density; and a large number of defects were left in the layer. Therefore, to consistently fabricate thin-film semiconductor devices such as p-Si TFTs using the conventional fabrication method, the electrical characteristics of the finished thin-film semiconductor devices had to be sacrificed.

Furthermore, in the conventional method of fabricating thin-film semiconductor devices, a problem is also acknowledged in that there is significant non-uniformity in the electrical characteristics of the finished thin-film semiconductor devices. Using conventional excimer laser light irradiation, the largest grain obtainable is approximately 1 $\mu$m. However, it is impossible to control the location of the grains and grain boundaries. Therefore, it is a random probability whether the channel formation region of a thin-film semiconductor device contains a grain boundary. The characteristics of a semiconductor device fluctuate considerably depending on whether the channel formation region contains a grain boundary. This is because if the number of grain boundaries that exist in the channel formation region is large, the electrical characteristics of the semiconductor device are poor, and if the number of grain boundaries that exist in the channel formation region is small, the electrical characteristics of the semiconductor device are comparatively good.

BRIEF SUMMARY OF THE INVENTION

The present invention takes into consideration the abovementioned situation, with the object of providing a method for consistently fabricating extremely high quality thin-film semiconductor devices by controlling the location of grain boundaries in the channel formation region.

Following an overview of the present invention, the fundamental principles of the present invention and its embodiments will be described in detail.

The present invention relates to a method of fabricating a thin-film semiconductor device wherein a semiconductor layer formed on a substrate is used as an active region (semiconductor device active region) of the semiconductor device. The semiconductor device active region designates, in a field effect transistor: a channel formation region, a junction region of the channel formation region and a source region, and a junction region of the channel formation region and a drain region. Alternatively, it designates, in a bipolar transistor: a base region, an emitter and base junction region, and a collector and base junction region. The present invention comprises: a heating system formation process for providing a local heating system on the substrate, which locally heats the semiconductor layer (active semiconductor layer) region that is to serve subsequently as the semiconductor device active region; an active semiconductor layer formation process for forming an active semiconductor layer after this heating system formation process; a crystallization process for melt crystallizing the active semiconductor layer in a condition wherein the active semiconductor layer is locally overheated by the local heating system; and an element separation process for processing the melt crystallized active semiconductor layer into an insular shape to form the semiconductor device active region.

In the present invention, based on the abovementioned construction, when the length of the finished semiconductor device active region is L ($\mu$m), the length L ($\mu$m) of the semiconductor device active region is made to be shorter than the length $L_{HS}$ ($\mu$m) of the local heating system ($L<L_{HS}$) in the local heating system formation process or the element separation process. Furthermore, at this time the active semiconductor layer is processed or the local heating system is formed such that the semiconductor device active region is contained within the local heating system in the lengthwise direction. The length $L_{HS}$ ($\mu$m) of the local heating system is preferably approximately 7 $\mu$m or less ($L_{HS}<7$ $\mu$m). In respect of the length of the semiconductor active region and the length of the local heating system, ideally the active semiconductor layer or the local heating system is processed such that the length of the semiconductor device active region L ($\mu$m) is approximately half the length $L_{HS}$ ($\mu$m) of the local heating system or less (L<$L_{HS}$/2), and the active semiconductor layer is processed such that the semiconductor device active region is completely contained within the local heating system in the lengthwise direction, and does not include the central area in the lengthwise direction of the local heating system.

Furthermore, in the present invention, based on the above-mentioned construction, when the width of the finished semiconductor device active region is W ($\mu$m), the width W ($\mu$m) of the semiconductor device active region is made to be shorter than the width $W_{HS}$ ($\mu$m) of the local heating system (W<$W_{HS}$) in the heating system formation process or the element separation process. It is preferable if the width W ($\mu$m) of the active region is made to be shorter than the width $W_{HS}$ ($\mu$m) of the local heating system by at least approximately 6 $\mu$m (W<$W_{HS}$−6 $\mu$m), and it is ideal if it is made to be shorter by at least approximately 8 $\mu$m (W<$W_{HS}$−8 $\mu$m). When the active semiconductor layer is processed, it is arranged such that the semiconductor device active region is contained within the local heating system in the widthwise direction. In addition, the active semiconductor layer is processed such that its edges in the lengthwise direction of the semiconductor device active region are located approximately 3 $\mu$m or more inside the edges in the lengthwise direction of the local heating system, preferably approximately 4 $\mu$m or more.

For the heating system formation process, a specific example is a process which includes a first semiconductor layer deposition process for depositing a first semiconductor layer on the substrate, a first semiconductor layer fabrication process for fabricating this first semiconductor layer into a predetermined shape, and an underside dielectric film formation process for forming an underside dielectric film on the first semiconductor layer. The first semiconductor layer is a semiconductor layer comprised mainly of silicon, whose thickness is preferably between approximately 25 nm and approximately 100 nm, and ideally between approximately 30 nm and approximately 70 nm. The thickness of the underside dielectric film is preferably between approximately 130 nm and approximately 180 nm.

The active semiconductor layer formation process may also include an amorphous semiconductor layer deposition process for depositing an amorphous semiconductor layer, and further include a semiconductor layer refinement process for enhancing the crystallization of this amorphous semiconductor layer. The semiconductor layer refinement process comprises a solid phase crystallization process for crystallizing the amorphous semiconductor layer in a solid state, and a melt crystallization refinement process for refining the crystallization of the amorphous semiconductor layer by passing it through a melted condition. Alternatively, both processes may be combined so that it comprises a solid phase crystallization process for crystallizing the amorphous semiconductor layer in a solid state, and a melt crystallization refinement process for refining the crystallization of the solid phase crystallized semiconductor layer by passing it through a melted condition. The active semiconductor layer is a semiconductor layer comprised mainly of silicon, and the thickness is preferably between approximately 30 nm and approximately 70 nm. The formation of the amorphous semiconductor layer includes a deposition step by chemical vapor deposition (CVD). Within the chemical vapor deposition process category, low pressure chemical vapor deposition (LPCVD) and plasma-enhanced chemical vapor deposition are particularly suitable for depositing amorphous semiconductor thin films; and it can be said further that amorphous semiconductor layer deposition in a high-vacuum low pressure chemical vapor deposition chamber or in a high-vacuum plasma-enhanced chemical vapor deposition chamber is ideal. A high-vacuum low pressure chemical vapor deposition chamber is a deposition system in which the background vacuum pressure immediately prior to semiconductor layer deposition is typically $5\times10^{-7}$ Torr or less, and that can achieve an atomic oxygen concentration within the amorphous semiconductor layer of approximately $2\times10^{16}$ cm$^{-3}$ or less even when the amorphous semiconductor layer is formed at a slow deposition rate of approximately 1.5 nm/min or less. Similarly, "high-vacuum plasma-enhanced chemical vapor deposition chamber" refers to a deposition system in which the background vacuum pressure immediately before semiconductor layer deposition is typically $1\times10^{-6}$ Torr or less, and that can achieve an atomic oxygen concentration within the deposited amorphous semiconductor layer of approximately $2\times10^{16}$ cm$^{-3}$ or less even when the deposition rate of the amorphous semiconductor layer is approximately 1 nm/sec or less. The solid phase crystallization process is performed by inserting a substrate on which an amorphous semiconductor layer has been formed into an annealing furnace and maintaining a state of near thermal equilibrium, or is performed with rapid thermal annealing equipment. If performed in an annealing furnace, solid phase crystallization proceeds at an annealing temperature of between approximately 400° C. and approximately 700° C. The melt crystallization refinement process is performed using an irradiating laser beam such as a xenon chlorine (XeCl) excimer laser ($\lambda$=308 nm) or a krypton fluorine (KrF) excimer laser ($\lambda$=248 nm).

In the crystallization process, light having an absorption coefficient in a polysilicon film at a temperature of 300K of between approximately $2\times10^{-4}$ nm$^{-1}$ and approximately $1\times10^{-1}$ nm$^{-1}$ irradiates the active semiconductor layer side, and melt crystallization of the active semiconductor layer progresses. The ideal absorption coefficient of light for the crystallization process in the polysilicon film is between approximately $1\times10^{-3}$ nm$^{-1}$ and approximately $1\times10^{-2}$ nm$^{-1}$. In order for the present invention to function effectively, when the thickness of the active semiconductor layer is x (nm), and the absorption coefficient of light radiated during the crystallization process in the polysilicon film is $\mu_{p\text{-}Si}$ (nm$^{-1}$), the result of multiplying the thickness of the active semiconductor layer x (nm) and the absorption coefficient of the radiated light $\mu_{p\text{-}Si}$ (nm$^{-1}$) satisfies the following relationship:

$$0.105 < x \times \mu_{p\text{-}Si} < 1.609$$

A more desirable result for this multiplication is:

$$0.105 < x \times \mu_{p\text{-}Si} < 0.693$$

Ideally:

$$0.105 < x \times \mu_{p\text{-}Si} < 0.405$$

A laser beam is desirable for the light irradiation in the crystallization process, and a pulsed laser beam is even better. For a pulsed laser beam, a harmonic of a solid-state laser having Q-switch oscillation is suitable. The wavelength of this light is between approximately 370 nm and approximately 710 nm, and more preferably between approximately 450 nm and 650 nm. The ideal pulsed laser wavelength for the present invention is approximately 532 nm. For the pulsed laser beam, a harmonic of a solid-state laser having Q-switch oscillation (a Q-switched solid-state laser) is preferred. Desirable as the lasing medium in a Q-switched solid-state laser are crystals doped with Nd ions, crystals doped with Yb ions, glass doped with Nd ions, glass doped with Yb ions, and so forth. Specifically, therefore, it is best to use as a pulsed laser beam the second harmonic (wavelength: 532 nm) of a Q-switched Nd:YAG laser (abbreviated as YAG 2ω), the second harmonic (wavelength: 532 nm) of a Q-switched Nd:YVO$_4$ laser, the second harmonic (wavelength: 524 nm) of a Q-switched Nd:YLF laser, the second harmonic (wavelength: 515 nm) of a Q-switched Yb:YAG laser, and so forth.

The shape of the irradiated region on the active semiconductor layer during the irradiation of the active semiconductor layer with a pulsed laser beam in the crystallization process is either nearly rectangular or a line profile, having width $W_L$ (μm) and length $L_L$ (mm). It is preferable that the widthwise direction of the irradiated region is nearly coincident with the lengthwise direction of the local heating system, and the lengthwise direction of the irradiated region is nearly coincident with the widthwise direction of the local heating system. Since the lengthwise direction of the local heating system and the lengthwise direction of the semiconductor device active region are coincident, and the widthwise direction of the local heating system and the widthwise direction of the semiconductor device active region are coincident, the widthwise direction of the irradiated region is nearly coincident with the lengthwise direction of the semiconductor device active region, and the lengthwise direction of the irradiated region is nearly coincident with the widthwise direction of the semiconductor device active region. Within the irradiated region, the pulsed laser's radiation energy density has a roughly trapezoidal distribution along the length of the region. On the other hand, along the width of the region, it is preferable to have a radiation energy density having either an approximately trapezoidal or approximately Gaussian distribution. It is desirable for the ratio ($L_L/W_L$) of the irradiated region length, $L_L$, to the width, $W_L$, to be greater than or equal to 100 and ideally greater than or equal to 1000. It is preferable for the maximum gradient of the radiation energy density along the width of the pulsed laser beam's profile to have a value of 3 mJ·cm$^{-2}$·μm$^{-1}$ or higher. If the location at which the maximum value of the radiation energy density gradient in the widthwise direction of this pulsed laser beam and the location at which the maximum value of the radiation energy density in the widthwise direction of the pulsed laser beam are nearly coincident, it is even better for fabricating high quality thin-film semiconductor devices. The width $W_L$ of the irradiated region must be at least larger than the length $L_{HS}$ of the local heating system, and the length $L_L$ of the irradiated region must be larger than the width $W_{HS}$ of the local heating system. The region on the active semiconductor layer irradiated by the pulsed laser beam is gradually shifted in the widthwise direction after each pulse until the entire surface of the substrate is completely irradiated. The widthwise direction of the irradiated region during pulsed laser beam irradiation is nearly parallel to the direction of electric current flow within the active layer of a finished, operating thin-film semiconductor device. During laser irradiation, the light irradiation is performed such that any given point on the active semiconductor layer is subjected to pulsed laser beam irradiation between one time and 40 times. The irradiation energy density of the pulsed laser beam on the active semiconductor layer is of an intensity that melts more than approximately a half of the thickness of the active semiconductor layer, and more preferably, is of an intensity that melts approximately two-thirds or more. Conversely, the upper limit of irradiation energy density is of an intensity that ablates a portion of the active semiconductor layer located on the local heating system. Ideally, it is of an intensity that almost completely melts the active semiconductor layer on the local heating system in the thickness direction, and does not completely melt the other part of the active semiconductor layer in the thickness direction. Specifically, when light having a wavelength of approximately 532 nm is used as the pulsed laser beam, the irradiation energy density of the pulsed laser beam on the active semiconductor layer is between approximately 350 mJ·cm$^{-2}$ and approximately 950 mJ·cm$^{-2}$, but is preferably between approximately 450 mJ·cm$^{-2}$ and approximately 950 mJ·cm$^{-2}$, or approximately 350 mJ·cm$^{-2}$ and approximately 625 mJ·cm$^{-2}$, and is ideally between approximately 450 mJ·cm$^{-2}$ and approximately 625 mJ·cm$^{-2}$.

In order for the present invention to be applicable to devices such as liquid crystal displays, it is desirable for the substrate to be transparent to visible light. Further, regardless of the application, it is also desirable for the substrate to be essentially transparent to the pulsed laser beam. "Essentially transparent" means that the absorption coefficient of the pulsed laser beam in the substrate is approximately one hundredth of the absorption coefficient in the polysilicon or lower. Specifically, the absorption coefficient of the substrate $\mu_{Sub}$ should be approximately $10^{-5}$ nm$^{-1}$ or lower.

According to a method of fabricating a thin-film semiconductor device of the present invention, it is possible to fabricate high quality thin-film semiconductor devices easily and stably by using a low temperature process, which enables a low cost glass substrate to be used. Therefore, if the present invention is applied to manufacturing active matrix liquid crystal display devices, it is possible to manufacture large sized, high quality liquid crystal display devices easily and stably. Further, also in a case where applied to manufacturing other electronic circuits, it is possible to produce high quality electronic circuits easily and stably.

BRIEF DESCRIPTION OF THE SEVERAL VIEWS OF THE DRAWINGS

FIG. 7 is a diagram for explaining a laser beam radiation profile of the present invention.

111, 211 Substrate, 112, 212 Underlevel protection layer, 113, 213 First semiconductor layer, 114, 214 Underside dielectric layer, 115, 215 Active semiconductor layer, 116, 216 YAG2ω laser beam, 117, 217 YAG2ω laser beam after transmission through an active semiconductor layer, 118,

218 Heat, 119, 219 Grain boundary, 120, 220 Gate dielectric layer, 121, 221 Gate electrode, 115a, 115c, 215a, 215c Source drain region, 115b, 215b Channel formation region, 122, 222 Interlevel dielectric layer, 123, 124, 223, 224 Source and drain electrodes.

DETAILED DESCRIPTION OF THE INVENTION

Basic Principle of the Present Invention

Figure 1:
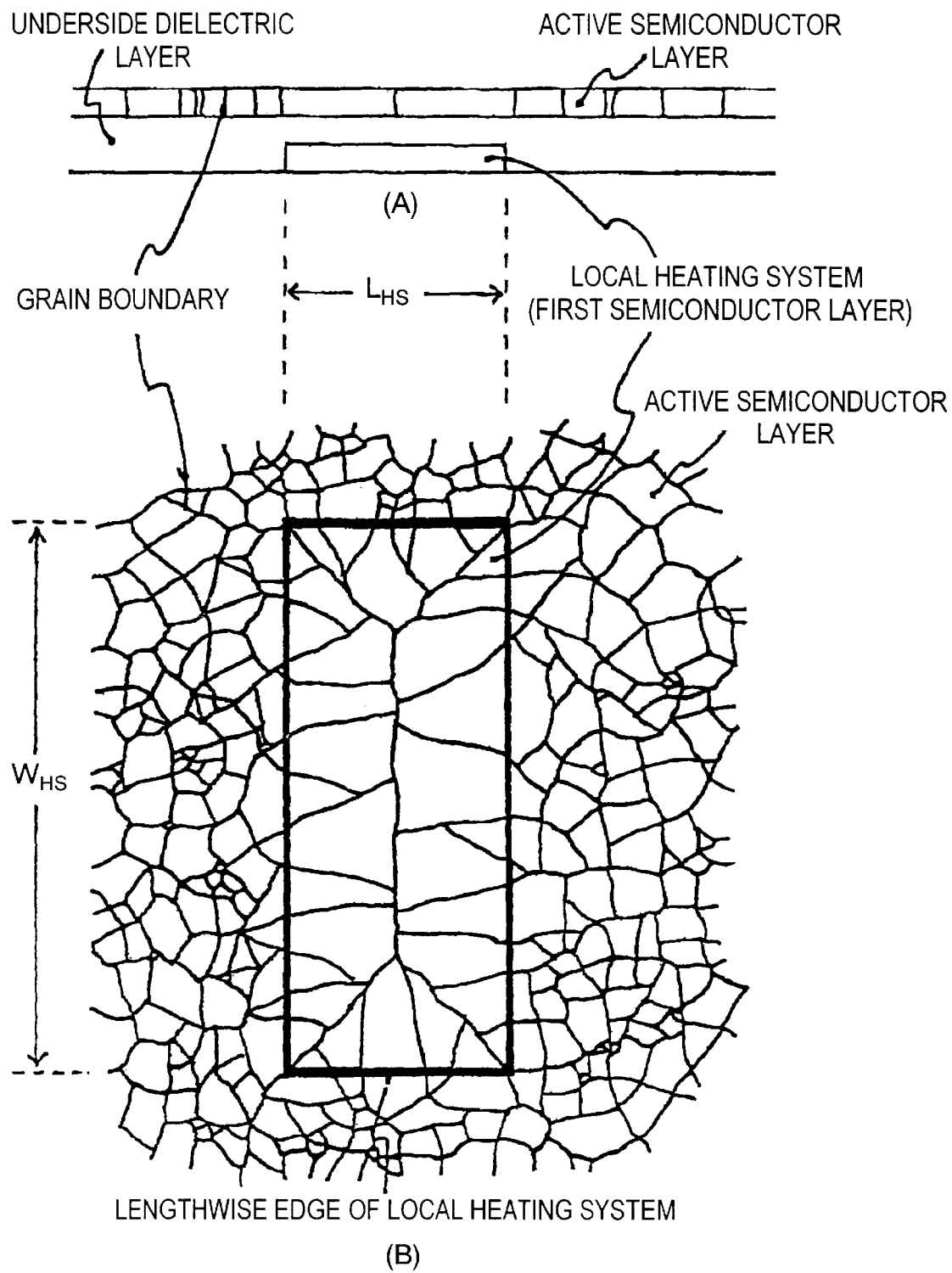
FIG. 1 is a diagram for explaining the present invention.
Figure 2:
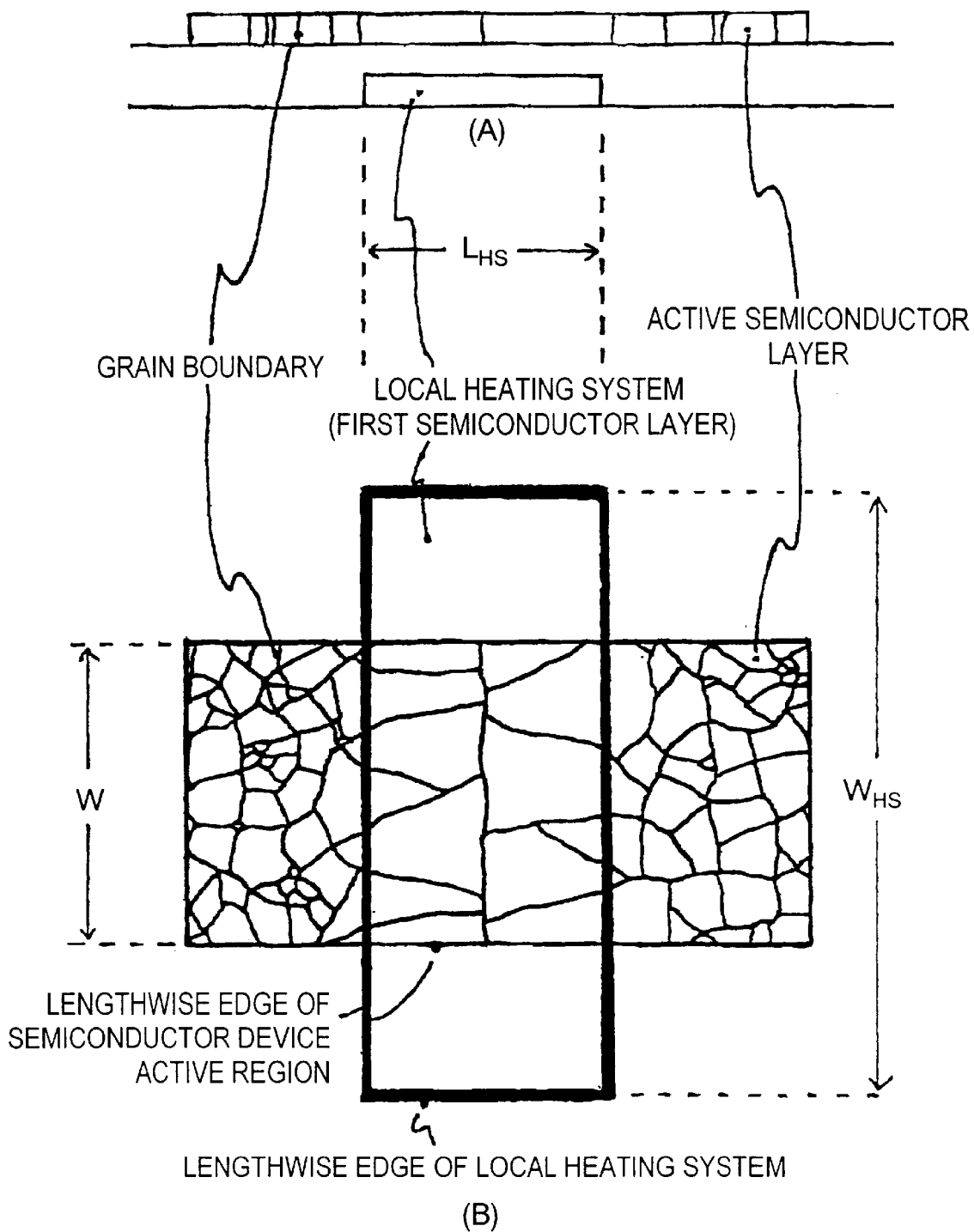
FIG. 2 is a diagram for explaining the present invention.
Figure 3:
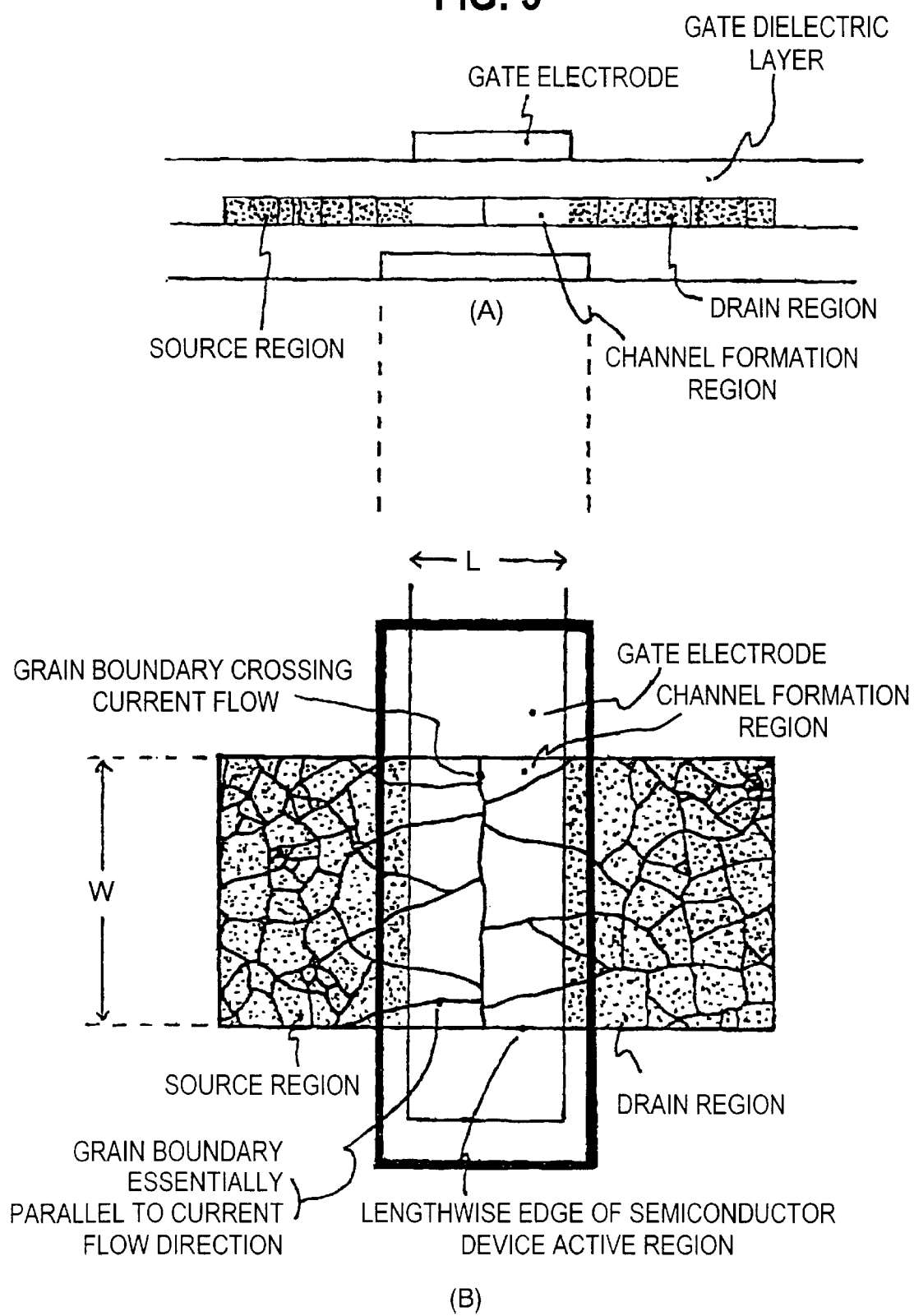
FIG. 3 is a diagram for explaining the present invention.
Figure 4:
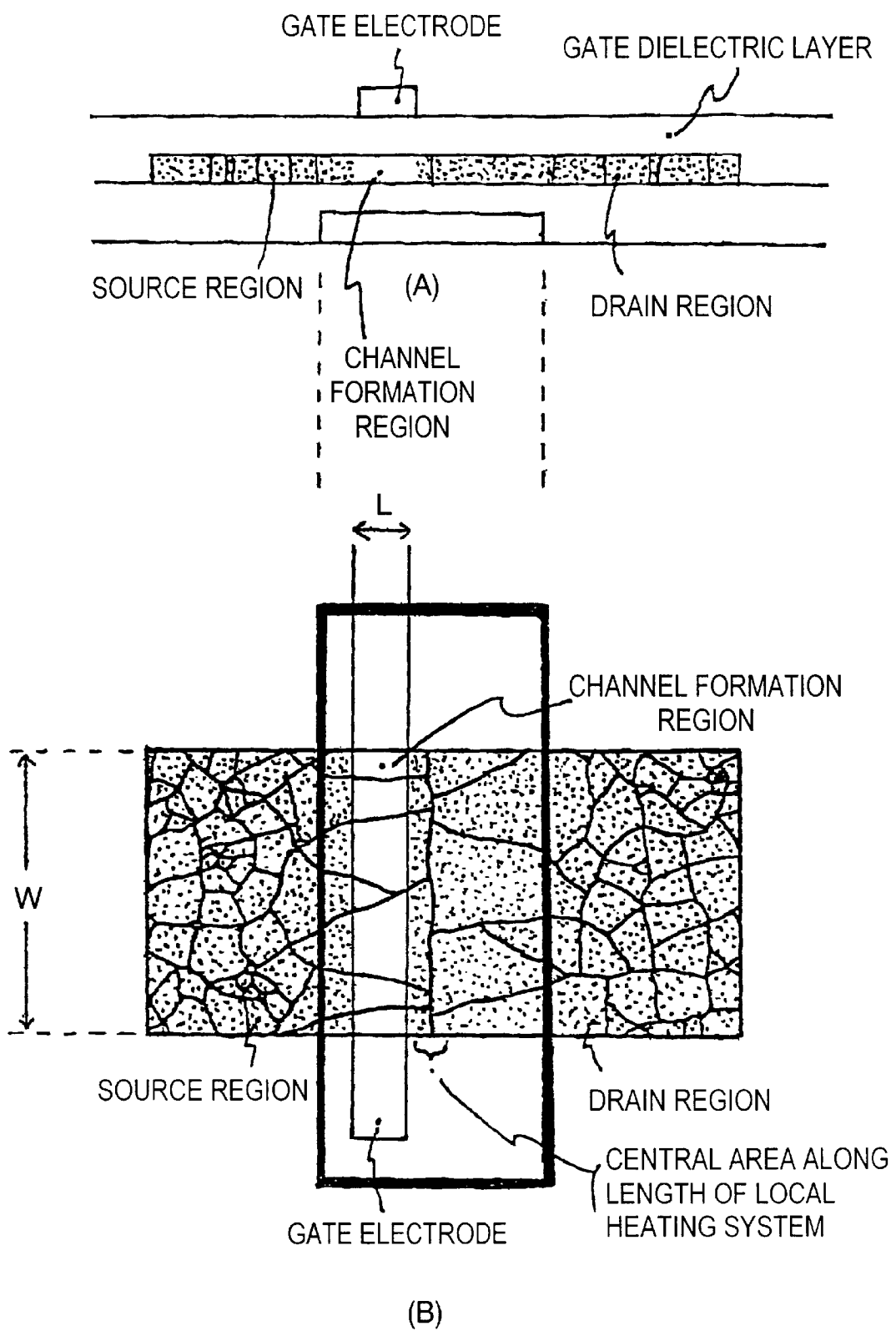
FIG. 4 is a diagram for explaining the present invention.

In the present invention, a portion of an active semiconductor layer, which subsequently becomes a semiconductor device active region, is melt crystallized in a condition wherein it is locally overheated by a local heating system, so that grains are selectively grown laterally on this portion (FIG. 1), and the laterally grown grains are used as a semiconductor device active region (FIG. 2). Since the location of grains can be controlled freely, the location of grain boundaries can also be controlled. As a result, grain boundaries are controlled in the semiconductor device active region (FIG. 3). Using the present invention, it is possible to ensure that the number of grain boundaries that cross the flow of electricity in the semiconductor device active region is always one (FIG. 3). Further, the optimal implementation of the present invention realizes even complete elimination of grain boundaries that cross the flow of electricity in the semiconductor device active region (FIG. 4). In this manner, the electrical characteristics of thin-film semiconductor devices are markedly improved and, at the same time, the electrical characteristics of all of the thin-film semiconductor devices formed on the substrate are made almost identical, and hence it is possible to reduce quality variations to a minimum.

One example of a local heating system is a first semiconductor layer formed on a substrate in an insular form. FIG. 1A is a cross-sectional view showing the relationship between a local heating system and an active semiconductor layer. Further, FIG. 1B is the plan view thereof. Both of the figures also show grain boundaries in the active semiconductor layer, which are obtained after the crystallization process. After forming the active semiconductor layer on the first semiconductor layer via an underside dielectric layer, a laser beam that passes through approximately 20% or more of the active semiconductor layer irradiates the active semiconductor layer side. The active semiconductor layer is melt crystallized by the irradiating laser beam. However, since the active semiconductor layer transmissivity of the irradiating light is then comparatively high, a part of the irradiating light also reaches the first semiconductor layer. In this manner, the first semiconductor layer also absorbs the laser beam, and the temperature is raised. On the other hand, in the area where there is no first semiconductor layer, the light passes through the substrate. As a result, only the active semiconductor layer on the first semiconductor layer is locally heated, and the temperature rises higher than the other areas. In the melt crystallization process, grains grow from lower temperature areas to higher temperature areas. Since only the portion having a local heating system underneath the active semiconductor layer reaches a high temperature compared with that of its periphery, during cooling solidification grains grow from the active semiconductor layer portion that is slightly outside the vicinity of the local heating system toward the active semiconductor layer part in the center of the local heating system. The temperature difference created by the local heating system develops lateral growth of grains during cooling and solidification. In this manner, in the active semiconductor layer, grains are grown in the required location (in other words, an area to be a semiconductor active region subsequently) under control, and afterwards, the active semiconductor layer is processed into a predetermined shape for component separation (cross-sectional view in FIG. 2A, plan view in FIG. 2B). At this time, the width of the semiconductor device active region W is made to be shorter than the width of the local heating system $W_{HS}$, so that the semiconductor device active region is formed such that the semiconductor device active region is contained completely inside the local heating system in the widthwise direction. In such a state, the semiconductor device active region is formed such that the length of the gate electrode L is made to be the same as or shorter than the length of the local heating system $L_{HS}$, and the semiconductor device active region is contained inside the local heating system in the lengthwise direction (sectional view in FIG. 3A, plan view in FIG. 3B). This ensures that there is always just one grain boundary in the direction that crosses the electric current flow in the semiconductor device active region. Since grains grow toward the center of the local heating system from approximately 1 μm outside the vicinity of the local heating system at an almost constant speed, the grains that grow from the right and left collide near the central area in the lengthwise direction. Accordingly, if an active semiconductor layer or a local heating system is formed such that the length of the semiconductor device active region L (μm) is approximately half the length of the local heating system $L_{HS}$ (μm) or less ($L<L_{HS}/2$), and further, the active semiconductor layer is processed such that the semiconductor device active region is completely contained in the local heating system in the lengthwise direction, and does not contain the central area in the lengthwise direction of the local heating system, it is possible to completely eliminate grain boundaries that cross the electric current flow inside the semiconductor device active region (cross sectional view in FIG. 4A, plan view in FIG. 4B).

DETAILED DESCRIPTION OF THE PRESENT INVENTION

The present invention relates to a method of fabricating thin-film semiconductor devices using as the active layer a crystalline semiconductor layer formed on a variety of transparent substrates, including low heat resistance glass substrates having a glass strain point between 550° C. and 650° C., or high heat resistance glass substrates such as quartz substrates, wherein a silicon oxide film serving as an underlevel protection layer is formed on the substrate where necessary, and there is provided on this underlevel protection layer or the substrate a local heating system (heating system formation process) for heating a semiconductor layer (active semiconductor layer) area that later becomes a semiconductor device active region, and an active semiconductor layer is formed after this heating system formation process (active semiconductor layer formation process). The active semiconductor layer is then melt crystallized (crystallization process) in a state in which the active semiconductor layer is locally overheated by the local heating system, and grains are selectively grown in the semiconductor device active region. Afterwards, the active semiconductor layer where grains are selectively grown by melt crystallization is processed into an insular shape to form a semiconductor device active region (component separation process).

The present invention, based on the abovementioned construction, firstly forms a local heating system on a substrate (heating system formation process). The local heating system, for example, comprises a first semiconductor layer formed on the substrate in an insular shape and an underside dielectric layer that covers this. Accordingly, a specific example of a local heating system formation process is a process including a first semiconductor layer deposition process for depositing a first semiconductor layer on a substrate, a first semiconductor layer forming process for forming this first semiconductor layer into a predetermined shape, and an underside dielectric layer forming process for forming an underside dielectric layer on the first semiconductor layer. The first semiconductor layer is a semiconductor layer comprised mainly of silicon. A semiconductor layer comprised mainly of silicon is a semiconductor material such as, for example, a silicon film (Si) or a silicon germanium film ($Si_xGe_{1-x}$:0<x<1) which designates a material whose major atomic constituent is silicon (proportion of silicon atoms of 80% or higher).

A role of the first semiconductor layer is to locally heat the active semiconductor layer formed on the underside dielectric layer. Heating is achieved such that the first semiconductor layer absorbs light transmitted through the active semiconductor layer, which raises the temperature of the first semiconductor layer itself. Therefore, only when the thickness is approximately 25 nm or more is light absorption by the first semiconductor layer significant, and accordingly, does the temperature of the first semiconductor layer increase sufficiently enough to heat the active semiconductor layer. In this manner, the active semiconductor layer located on the first semiconductor layer is locally heated by the first semiconductor layer, and grains whose positions are controlled in the active semiconductor layer grow laterally. Conversely, if the first semiconductor layer is too thick, the heat capacity of the first semiconductor layer increases, as a result of which the temperature of the first semiconductor layer does not increase sufficiently. It is only when the thickness is approximately 100 nm or less that the first semiconductor layer exhibits sufficient temperature increase to induce lateral growth of grains whose positions are controlled in the active semiconductor layer. The lateral growth distance in the active semiconductor layer is thus highly dependent on the thickness of the first semiconductor layer. According to experiments by the inventor, the ideal thickness of the first semiconductor layer with which the laterally grown grains become the largest, of the order of 3.5 μm, is between approximately 30 nm and approximately 70 nm.

For the present invention, the required thickness of the first semiconductor layer is between approximately 25 nm and approximately 100 nm, and the thickness of the active semiconductor layer for improved transistor characteristics is between approximately 20 nm and approximately 95 nm. Since the wavelength of light radiated in the crystallization process is between approximately 370 nm and approximately 710 nm, if the local heating system and the active semiconductor layer are formed as a three layer structure, being a first semiconductor layer, an underside dielectric layer, and an active semiconductor layer, light does not reach the first semiconductor layer during the crystallization process due to light interference and reflection, and hence a situation arises in which lateral growth does not occur in the active semiconductor layer depending on the refractive index and thickness of the underside dielectric layer. According to optical simulation and experiments by the inventor and others, when a silicon oxide layer is used for the underside dielectric layer, the thickness of the underside dielectric that achieves the most lateral growth of grains in the active semiconductor layer is between approximately 130 nm and approximately 180 nm.

When the length of a finished semiconductor device active region is L (μm), the length of the semiconductor device active region L (μm) is made to be equal to (L~$L_{HS}$) or less than (L<$L_{HS}$) the length of the local heating system $L_{HS}$ (μm) in the local heating system formation process or the component separation process. Further, at this time, the local heating system is formed in advance such that the semiconductor device active region is contained within the local heating system in the lengthwise direction, or the active semiconductor layer is processed such that the semiconductor device active region is contained within the local heating system in the lengthwise direction (sectional view in FIG. 3A, plan view in FIG. 3B). Grain growth in the active semiconductor layer consistently starts at a position approximately 1 μm outside the local heating system. Therefore, if the local heating system and the semiconductor device active region are formed according to the abovementioned positional relationship, it is possible to ensure that the number of grain boundaries (grain boundaries that cross the electric current flow) that cross in the lengthwise direction (electric current flow direction during operation of semiconductor device) within the semiconductor device active region is always one. Further, it is preferable that the length of the local heating system $L_{HS}$ (μm) is approximately 7 μm or less ($L_{HS}$<7 μm). According to experiments by the inventor and others, the maximum distance of lateral grain growth is approximately 3.5 μm. Therefore, in order for grains to grow laterally inwards from both the left and right sides of the local heating system to form only one grain boundary that crosses the electric current flow in the central area in the lengthwise direction of the local heating system, the length of the local heating system must be shorter than double the maximum distance of lateral growth. Moreover, in order for a plurality of thin-film semiconductor devices formed on the substrate to all exhibit the same characteristics, it is desirable that every one of the thin-film semiconductor devices possesses only one grain boundary within the active region. Considering fluctuation of grain growth distance, the required length of the local heating system is approximately 5 μm or less. In this manner, all of the thin-film semiconductor devices formed on the substrate exhibit almost the same characteristics. In respect of the length of the semiconductor device active region and the length of the local heating system, ideally the active semiconductor layer or the local heating system is formed such that the length of the semiconductor device active region L (μm) is approximately half the length of the local heating system $L_{HS}$ (μm) or less (L<$L_{HS}$/2), and further the active semiconductor layer is processed such that the semiconductor device active region is completely contained within the local heating system in the lengthwise direction, and does not contain the central area in the lengthwise direction of the local heating system (sectional view in FIG. 4A, plan view in FIG. 4B). A grain boundary that crosses the electric current flow is formed in the central area in the lengthwise direction of the local heating system consistently as mentioned previously. Therefore, if the semiconductor device active region is formed such that it is completely contained within the local heating system, avoiding the central area, a plurality of current paths that do not cross a grain boundary is formed within the active region consistently. As a result, the thin-film semiconductor device turns out as a parallel-connected plurality of small silicon-on-insulator (SOI) devices using single crystal silicon thin films, and the performance is thus greatly improved. Here, the central area in the lengthwise direction of the local heating system means a region extending approximately 0.25 μm from the center in the lengthwise direction to the right and left sides, which is a region of approximately 0.5 μm in length formed in the central area.

In respect of the widthwise direction, in addition to the construction described above, when the width of a finished semiconductor device active region is W ($\mu$m), the local heating system is formed in the heating system formation process in advance such that the width of the semiconductor device active region W ($\mu$m) is shorter than the width of the local heating system $W_{HS}$ ($\mu$m) (W<$W_{HS}$), or the semiconductor device active region is formed in the component separation process such that the width of the semiconductor device active region W ($\mu$m) is shorter than the width of the local heating system $W_{HS}$ ($\mu$m) (W<$W_{HS}$), and the arrangement is also such that the semiconductor device active region is completely contained within the local heating system in the widthwise direction (plan view in FIG. 2B). As FIG. 1B shows, lateral growth in the active semiconductor layer also occurs from the edges in the lengthwise direction. Since grain boundaries formed in this manner become ones that cross the electric current flow, they must be eliminated from the semiconductor device active region. In order to eliminate the grain boundaries crossing the electric current flow, which grow from the edges in the lengthwise direction of the local heating system, from the semiconductor device active region, it is necessary for the width of the semiconductor device active region to be shorter than the width of the local heating system, and also the semiconductor device active region must be completely contained within the local heating system in the widthwise direction. Specifically, it is preferable that the width of the active region W ($\mu$m) be at least approximately 6 $\mu$m shorter (W<$W_{HS}$−6 $\mu$m) than the width of the local heating system $W_{HS}$ ($\mu$m), and ideally is at least approximately 8 $\mu$m shorter (W<$W_{HS}$−8 $\mu$m). Furthermore, the active semiconductor layer is processed such that the edges of the semiconductor device active region in the lengthwise direction are approximately 3 $\mu$m or more inside the edges in the lengthwise direction of the local heating system, and are preferably located approximately 4 $\mu$m or more inside. The distance of lateral growth of the present invention is approximately 3.5 $\mu$m at maximum, and is normally between approximately 2.5 $\mu$m and 3.0 $\mu$m. Therefore, if the width of the active region is at least approximately 6 $\mu$m shorter than the width of the local heating system, and also the edges of the semiconductor device active region in the lengthwise direction are positioned approximately 3.0 $\mu$m or more inside the edges in the lengthwise direction of the local heating system, it is possible to eliminate most of the grain boundaries growing from the edges in the lengthwise direction of the local heating system (plan view in FIG. 2B). Since the maximum distance of lateral growth is approximately 3.5 $\mu$m, if the width of the active region is at least approximately 8 $\mu$m shorter than the width of the local heating system, and also the edges in the lengthwise direction of the semiconductor device active region are positioned approximately 4.0 $\mu$m or more inside both edges in the lengthwise direction of the local heating system, it is possible to completely eliminate the grain boundaries growing from the edges in the lengthwise direction of the local heating system from the semiconductor device active region (plan view in FIG. 2B).

The active semiconductor layer formation process may include an amorphous semiconductor layer deposition process for depositing an amorphous semiconductor layer, and may also include a semiconductor layer refinement process for enhancing the crystallization of this amorphous semiconductor layer. The semiconductor layer refinement process comprises a solid phase crystallization process for crystallizing amorphous semiconductor layers in a solid phase state, and a melt crystallization refinement process for refining the crystallization of amorphous semiconductor layers via a melted state. Alternatively, by combining the both, it may comprise the two, a solid phase crystallization process for crystallizing amorphous semiconductor layers in a solid phase state, and a melt crystallization refinement process for refining these crystallized semiconductor layers via a melted state. The simplest process is to make amorphous semiconductor layer deposition an active semiconductor layer formation process. The present invention is, of course, effective with this simple process. However, a preferable one is a process in which the active semiconductor layer formation process includes a semiconductor layer refinement process. Lateral grain growth during the crystallization process performed after the present process progresses in a form of epitaxial growth, in a state in which the active semiconductor layer on the local heating system is almost completely melted, from the non-melted part at the periphery. If the active semiconductor layer formation process includes a semiconductor layer refinement process, since lateral growth proceeds using high quality grains having a small number of internal crystal defects as grain growth nuclei, grains after lateral growth also become high quality grains having a small number of internal defects. In order to produce grains having a small number of internal defects as grain growth nuclei, it is best to provide a melt crystallization refinement process for refining the crystallization by passing the amorphous semiconductor layer through a melted state. It is desirable that the melt crystallization refinement process is performed by radiating ultraviolet radiation that does not influence the local heating mechanism on the semiconductor layer. For the ultraviolet radiation, laser beams such as those from a xenon chlorine (XeCl) excimer laser ($\lambda$=308 nm) or a krypton fluorine (KrF) excimer laser ($\lambda$=248 nm) are used. If the semiconductor layer refinement process includes a solid phase crystallization process, each grain expands to the order of several $\mu$m, and lateral growth occurs using these large grains as grain growth nuclei, so that the number of grain boundaries running almost parallel to the electric current flow direction, in other words, the number of grain boundaries located within the semiconductor device active region is reduced. Therefore, a high quality thin-film semiconductor device that exhibits steep sub-threshold characteristics with low threshold voltage is created. The solid phase crystallization process is performed either by inserting the substrate on which the amorphous crystalline semiconductor layer has been formed into an annealing furnace and conducting crystallization in a state of near thermal equilibrium, or is performed using rapid thermal annealing equipment. If performed in an annealing furnace, solid phase crystallization proceeds at a heat treatment temperature of between approximately 400° C. and approximately 700° C. A polycrystalline semiconductor layer obtained by solid phase crystallization has large grains of the order of several $\mu$m. However, there is a disadvantage in that it contains a large number of internal defects. On the other hand, a polycrystalline semiconductor layer obtained by a melt crystallization refinement process has tidy grains without internal defects. However, there is a disadvantage in that the grain size is small. In order to obtain a polycrystalline layer comprising large grains, of the order of several $\mu$m, and that has a small number of internal defects, after the solid phase crystallization process for crystallizing an amorphous semiconductor layer in a solid phase, a melt crystallization refinement process may be added for refining the crystallization of this solid phase crystallized polycrystalline semiconductor layer via a melted state. By this method, grain growth nuclei during lateral growth become large sized grains with fewer defects, and hence the number of grain boundaries located within the semiconductor device active region is markedly reduced, and also almost defect-free lateral growth grains can be obtained. As a result, it is possible to fabricate an extremely high quality thin-film semiconductor device.

An active semiconductor layer is a semiconductor layer comprised mainly of silicon (a semiconductor material such as a silicon film (Si) or a silicon germanium film ($Si_xGe_{1-x}$:0<x<1)), having a thickness of between approximately 20 nm and approximately 95 nm, or preferably between approximately 30 nm and approximately 70 nm. If the thickness is approximately 20 nm or more, even when a large substrate having a substrate area of approximately 2000 $cm^2$ or more is used, lateral growth of grains is possible over the whole surface of the substrate. If the active semiconductor layer is very thick, a temperature difference occurs in the vertical direction of the layer. However, if it is approximately 95 nm or less, lateral growth starts easily, and hence the present invention functions effectively. The essence of the present invention is that part of the light radiated in the crystallization process passes through an active semiconductor layer, and is absorbed by a local heating system. According to experiments by the inventor, the thickness of an active semiconductor layer that exhibits the greatest lateral growth during YAG 2ω laser beam irradiation is between approximately 30 nm and approximately 70 nm. This is because, within this thickness range, irradiating light passes through approximately 70% or more of the active semiconductor layer, and also optical interference conditions are met such that the transmitted light enters into the first semiconductor layer effectively.

Chemical vapor deposition (CVD) is a convenient method for the amorphous semiconductor layer deposition process. Within the chemical vapor deposition process category, low pressure chemical vapor deposition (LPCVD) and plasma-enhanced chemical vapor deposition are particularly suitable for depositing amorphous semiconductor thin films; and it can be said further that amorphous semiconductor layer deposition in a high-vacuum low pressure chemical vapor deposition chamber or in a high-vacuum plasma-enhanced chemical vapor deposition chamber is ideal. This is because increasing the purity of the semiconductor film minimizes the generation of crystal nuclei that result from impurities and allows lateral growth to occur accurately, and further, the resultant crystalline semiconductor films are of high purity. A high-vacuum low pressure chemical vapor deposition system means one in which the background vacuum pressure immediately prior to semiconductor layer deposition is typically $5 \times 10^{-7}$ Torr or less, and that can achieve an atomic oxygen concentration within the amorphous semiconductor layer of approximately $2 \times 10^{16}$ $cm^{-3}$ or less even when the amorphous semiconductor layer is formed at a slow deposition rate of approximately 1.5 nm/min or less. It is desirable that this type of high-vacuum low pressure chemical vapor deposition system not only has superior deposition chamber air-tightness but also has high exhaust performance, with an exhaust rate in the deposition chamber of approximately 120 sccm/mTorr or higher (an exhaust rate at which the equilibrium pressure obtained with an inert gas is flowing at 120 sccm into the chamber is 1 mTorr). This is because systems having the aforesaid high exhaust performance can sufficiently decrease substrate outgassing and so forth in a relatively short period of time of about one hour, maintain high throughput, and, further, enable deposition of high purity semiconductor thin films. Low pressure chemical vapor deposition is difficult to use when large-sized substrates having an area of 2000 $cm^2$ or greater are used. When amorphous semiconductor films are deposited under these conditions, a high-vacuum plasma-enhanced chemical vapor deposition system is used. This type of deposition system typically has a background pressure immediately prior to semiconductor film deposition of $1 \times 10^{-6}$ Torr or lower and can achieve an atomic oxygen concentration within the semiconductor of $2 \times 10^{16}$ $cm^{-3}$ or less even for amorphous semiconductor films that have been deposited at a low deposition rate of 1 nm/sec or less. The most suitable type of high vacuum plasma-enhanced chemical vapor deposition system is a plasma box type of PECVD reactor in which the plasma processing deposition chamber is located within another larger vacuum chamber. A plasma box type of PECVD reactor has the effect of having higher vacuum in the deposition chamber because the deposition chamber has a double vacuum construction; and, at the same time, is a hot wall type of plasma enhanced-chemical vapor deposition system in which the entire walls of the deposition chamber are heated and the wall temperature and substrate temperature become essentially identical at the time of deposition. This is recognized as having the effect of minimizing the amount of outgassed impurities from the deposition chamber wall and increasing the vacuum. Since thus improving the background vacuum pressure during amorphous semiconductor film deposition also decreases the amount of outgassing from the chamber walls the purity of the deposited semiconductor layer is increased, and an effect that lateral growth is accelerated is produced. Although the background pressure of a high-vacuum plasma-enhanced chemical vapor deposition system is inferior to the background pressure of a high-vacuum low pressure chemical vapor deposition system, the impurity density within the semiconductor layer can be markedly reduced because the semiconductor layer deposition rate can be accelerated to 0.1 nm/sec or higher. Monosilane ($SiH_4$) or disilane ($Si_2H_6$) are used as source gases in semiconductor layer deposition, and the substrate temperature during deposition should be between approximately 100° C. and approximately 450° C. Because the level of hydrogen contained in the amorphous silicon semiconductor layer decreases as substrate temperature rises, the subsequent crystallization process progresses stably. Ideally, the substrate temperature during amorphous silicon layer deposition is between approximately 250° C. and approximately 450° C.

In the crystallization process, light having an absorption coefficient in the polysilicon film at a temperature of 300K of between approximately $2 \times 10^{-4}$ $nm^{-1}$ and approximately $1 \times 10^{-1}$ $nm^{-1}$ irradiates the active semiconductor layer side, and melt crystallization of the active semiconductor layer progresses. The wavelength of light corresponding to such an absorption coefficient is between approximately 370 nm and approximately 710 nm. The ideal absorption coefficient of light for the crystallization process in the polysilicon film is between approximately $1 \times 10^{-3}$ $nm^{-1}$ and approximately $1 \times 10^{-2}$ $nm^{-1}$, and the corresponding wavelength is between approximately 450 nm and approximately 650 nm. In order for the present invention to function effectively, when the thickness of the active semiconductor layer is x (nm), and the absorption coefficient of light radiated during the crystallization process in the polysilicon film is $\mu_{p\text{-}Si}$ ($nm^{-1}$), the result of multiplying the thickness of the active semiconductor layer x (nm) and the absorption coefficient of the radiated light $\mu_{p\text{-}Si}$ ($nm^{-1}$) satisfies the following relationship:

$$0.105 < x \times \mu_{p\text{-}Si} < 1.609$$

A more desirable result for this multiplication is:

$$0.105 < x \times \mu_{p\text{-}Si} < 0.693$$

Ideally:

$$0.105 < x \times \mu_{p\text{-}Si} < 0.405$$

Light is absorbed in the semiconductor layer and the incident light intensity is reduced exponentially. If the incident light intensity is $I_{(0)}$, the distance from the surface of the polycrystalline active semiconductor layer comprised mainly of silicon is x (nm), and the intensity at location x is $I_{(x)}$, using the absorption coefficient $\mu_{pSi}$ satisfies the following equation:

$$I_{(x)}/I_{(0)} = \exp(-\mu_{pSi} \times x) \quad \text{(Equation 1)}$$

If the absorption coefficient $\mu_{pSi}$ is approximately $2 \times 10^{-4}$ nm$^{-1}$ or more, the active semiconductor layer can be melt crystallized, and if approximately $1 \times 10^{-3}$ nm$^{-1}$ or more, even when the active semiconductor layer is thin, of the order of approximately 20 nm, approximately 2% or more of the light is absorbed in the active semiconductor layer, and hence the active semiconductor layer is easily melt crystallized. If the absorption coefficient in the polysilicon film is approximately $1 \times 10^{-1}$ nm$^{-1}$ or less, the incident light passes through the active semiconductor layer, reaching the local heating system, and further, if approximately $1 \times 10^{-2}$ nm$^{-1}$ or less, even when the active semiconductor layer is thick, of the order of approximately 95 nm, approximately 40% of the incident light reaches the local heating system, so that lateral growth occurs in the active semiconductor layer region. In order for the active semiconductor layer to be heated effectively, it is preferable that at least 10% of the incident light is absorbed in the semiconductor layer. This is achieved when the multiplication of the thickness of the active semiconductor layer and the absorption coefficient satisfies the following condition:

$$0.105 < x \times \mu_{p\text{-}Si}$$

Furthermore, in order for the active semiconductor layer to function effectively, it is desirable that at least approximately 20% or more of the incident light passes through the active semiconductor layer, and the multiplication of the thickness of the active semiconductor layer and the absorption coefficient needs to satisfy the following relationship:

$$x \times \mu_{p\text{-}Si} < 1.609$$

In order to ensure lateral growth in the active semiconductor layer, it is preferable that approximately 50% or more of the incident light passes through the active semiconductor layer, and the condition for that is:

$$x \times \mu_{p\text{-}Si} < 0.693$$

An ideal system in which the present invention functions most efficiently is that the thickness of the active semiconductor layer and absorption coefficient satisfy the following condition when approximately two thirds or more of the incident light passes through the active semiconductor layer:

$$x \times \mu_{p\text{-}Si} < 0.405$$

Figure 5:
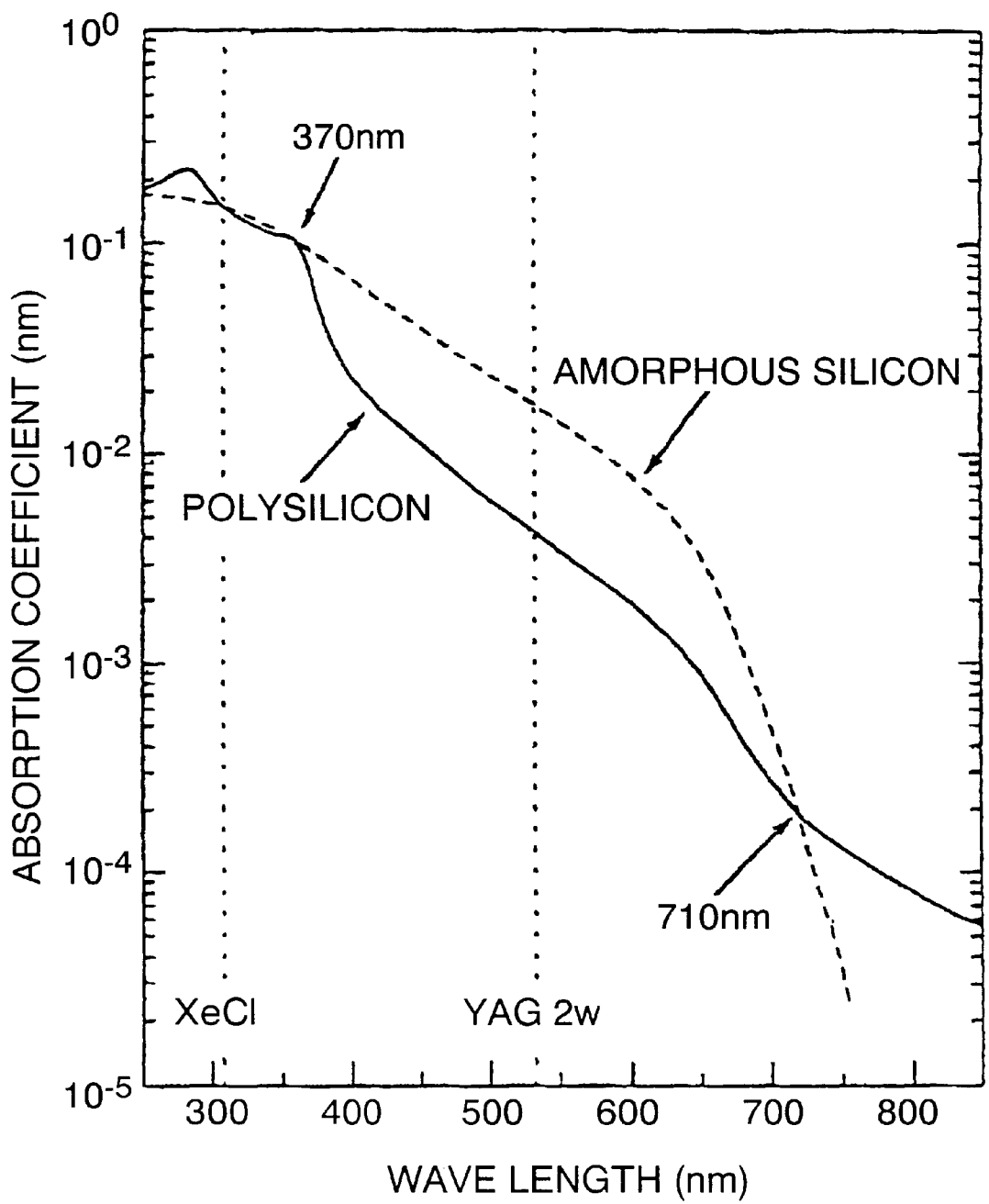
FIG. 5 is a diagram for explaining a relationship between light wavelength and absorption coefficient.

Light irradiated in the crystallization process is preferably laser light for the reason that it melts semiconductor layers easily. A continuous oscillation laser can be used as the irradiating light source, but using pulsed oscillation is preferable. Irradiating the semiconductor layer with a continuous oscillation laser causes the semiconductor layer to be in a melted state for a long period of time of several milliseconds or more. Therefore, the film becomes more susceptible to contamination by vapor phase impurities and becomes more susceptible to surface roughness. Furthermore, since the melt time period is long, there is a strong tendency for the temperature distribution in the lateral direction within the active semiconductor layer to be lost, and hence it is difficult to generate lateral growth. On the other hand, with pulsed oscillation, which enables movement of a suitable distance at each pulse of radiation, the melt time period is several hundred microseconds or less, so that a polycrystalline semiconductor thin-film with a planar high purity surface is obtained. Furthermore, owing to the short melt period, the temperature gradient in the lateral direction is not lost until the time of cooling and solidification, and thus it is possible to grow grains laterally on the local heating system selectively. For a laser beam for irradiating the semiconductor layer, a pulsed laser beam of a wavelength between 370 nm and 710 nm is used. The absorption coefficients of these beams in amorphous silicon and in polycrystalline silicon are shown in FIG. 5. The horizontal axis in FIG. 5 is the wavelength of the beam, and the vertical axis is the absorption coefficient. The dashed line represents amorphous silicon while the solid line represents polysilicon. As shown in FIG. 5, in the wavelength range between 370 nm and 710 nm, the absorption coefficient is larger in amorphous silicon than in polysilicon. For example, the absorption coefficient of amorphous silicon $\mu_{aSi}$ and the absorption coefficient of polycrystalline silicon $\mu_{pSi}$ are $$\mu_{aSi} \text{ (YAG } 2\omega) = 0.01732 \text{ nm}^{-1} \text{ and}$$

$$\mu_{pSi} \text{ (YAG } 2\omega) = 0.00426 \text{ nm}^{-1},$$

respectively, at a wavelength of approximately 532 nm, which corresponds to the second harmonic of a Nd-doped YAG laser (abbreviated as YAG $2\omega$). The absorption coefficient in amorphous silicon is more than four times the absorption coefficient in polycrystalline silicon. There is an active semiconductor layer with lateral growth and the solid phase crystallized polycrystalline film is composed microscopically of crystalline and non-crystalline components. The crystalline components have a relatively small number of defects such as stacking faults within the grains and can be said to possess good crystal quality. On the other hand, the non-crystalline components can be seen to contain regions with noticeable structural disorder such as in the grain boundaries and within grains and can be said to be close to so-called amorphous in nature. In melt crystallization in which crystallization occurs through laser beam irradiation, the unmelted regions become grain growth nuclei during the cooling solidification process. If crystalline components with a high degree of structural order act as grain growth nuclei, grains which grow from these regions also exhibit a high degree of structural order and result in a high quality crystalline film. In contrast, if regions with structural disorder act as grain growth nuclei, stacking faults and other defects originate from these locations during the cooling solidification process, ultimately producing films that are of low quality and contain defects. Consequently, in order to produce high quality crystalline films, the crystalline components within the laterally grown active semiconductor films should act as grain growth nuclei without melting. Moreover, if the amorphous regions are melted preferentially with multiple pulses of laser irradiation, this gives a desirable situation. For the irradiated laser beam applied to the present invention, the absorption coefficient in amorphous silicon is larger than the absorption coefficient in polycrystalline silicon; hence, the amorphous components are heated preferentially with respect to the crystalline components. As a result, because grain boundaries, defects, and other amorphous components melt easily while the high quality crystalline components, which act as though essentially single crystalline in nature, remain intact without melting and act as grain growth nuclei, excellent grains having an extremely low number of defects are formed in the cooling solidification process. In this way, defects and dangling bonds are significantly reduced and high symmetry grain boundaries having a high degree of structural order predominate. From the perspective of the electrical characteristics of the semiconductor films, the phenomenon described above leads to a significant decrease in the density of trap states that appear near the middle of the band gap in the energy band diagram. Additionally, if semiconductor films such as those described above are used for the semiconductor device active layer (source and drain regions as well as the channel region), transistors with low off-currents, steep subthreshold characteristics (small subthreshold swing), and low threshold voltages result. The most effective light for reducing the internal defects in the laterally grown crystal grain is when the ratio of the absorption coefficient in polycrystalline silicon to the absorption coefficient in amorphous silicon ($\mu_{pSi}/\mu_{aSi}$) is large. From FIG. 5, it can be seen that this ratio is large in the wavelength range between approximately 450 nm and 650 nm. Therefore, from the viewpoint that the internal crystal defects in the laterally grown active semiconductor layer are reduced, it can be said that the most desirable wavelength for the pulsed laser beam used for irradiation in the laser irradiation step in the present invention is between approximately 450 nm and 650 nm.

Because ultimately, the pulse stability of the laser beam is the most important factor in obtaining final high quality crystalline semiconductor films, a pulsed laser beam produced by a Q-switched oscillation solid-state light emitting element is preferred. (This is abbreviated as a Q-switched solid-state laser in this disclosure.) In particular, in the present invention, the active semiconductor layer on the local heating system is almost completely melted. Therefore, if the laser oscillation is not stable, the active semiconductor layer disappears or is damaged, making fabrication of high quality thin-film semiconductor devices difficult. With the excimer gas laser of the prior art, the variation in pulse intensity was about 5% resulting from such things as non-uniformity of the xenon (Xe) and chlorine (Cl) gases in the laser resonator cavity, deterioration of the gases themselves or halogen erosion of the resonator cavity. Additionally, variation in the lasing angle was also of the order of 5%. Because the variation in the lasing angle caused variation in the area of the irradiation region, the result was that the energy density (energy per unit area) on the surface of the semiconductor film varied by a total of as much as 10% or more. Further, the long term stability of the laser pulses was lacking and led to within-lot variation of the thin-film semiconductor devices. Therefore, even if the laser light passed through the active semiconductor satisfying the lateral growth conditions of the present invention, if the conventional gas laser was used, the variation in the energy density on the active semiconductor film surface was great, so that the active semiconductor layer was severely damaged prior to lateral growth occurring. In contrast, because these types of problems do not exist with solid-state lasers, the laser oscillation is extremely stable, allowing variation in the energy density on the active semiconductor film surface (the ratio of the standard deviation to the mean) to be less than about 5%. In order to more effectively apply the present invention practically, the use of a solid-state laser which can maintain the variation in laser energy density on the surface of the semiconductor film at less than 5% as described above is required. Additionally, the use of a solid-state laser leads to such effects as the minimization of within-lot variation during the production of thin-film semiconductor devices and improvements in thin-film semiconductor device production throughput, as well as cost decreases by alleviating the burdensome task of frequently exchanging gas supplies which existed previously. A solution that can simultaneously meet the previously described demands for wavelength and absorption coefficient as well as the demand for solid-state is the second harmonic (YAG 2ω, wavelength of 532 nm) of the neodymium-doped yttria-alumina-garnet (Nd: YAG) laser in which neodymium (Nd) has been added to the compound oxide of yttrium oxide ($Y_2O_3$) and aluminum oxide ($Al_2O_3$). Consequently, in the crystallization processing step of the present invention, the most appropriate irradiation of the active semiconductor film is by the YAG 2ω which keeps the energy density variation on the surface of the active semiconductor film to less than about 5%. Desirable as a laser medium in a Q-switched solid state laser are crystals doped with Nd ions, crystals doped with Yb ions, glass doped with Nd ions, glass doped with Yb ions, and so forth. Specifically, therefore, other than a YAG 2ω, it is best to use as a pulsed laser beam, the second harmonic (wavelength of 532 nm) of a Q-switched Nd:YVO$_4$ laser beam, the second harmonic (wavelength of 524 nm) of a Q-switched Nd:YLF laser beam, the second harmonic (wavelength of 515 nm) of a Q-switched Yb:YAG laser beam, and so forth.

It is also important to control the irradiation energy density of the pulsed laser beam on the semiconductor film in order to obtain high quality crystalline semiconductor thin films. In other words, to produce superior thin-film semiconductor devices, control of the irradiation energy density within an appropriate range is essential. First, in order to promote melt crystallization where the lateral growth occurs in the active semiconductor film on the local heating system, it is necessary to have a laser beam having sufficient intensity to melt at least about half in the thickness direction of the active semiconductor film on the local heating system (in the present patent disclosure, this is abbreviated to ½ melting energy density ($E_{1/2}$)). This is the absolute minimum value of the appropriate range for the irradiation energy density of the pulsed laser beam in the crystallization process. Since the active semiconductor film on the local heating system is heated more than the other active semiconductor film, then at this energy density ($E_{1/2}$), parts other than the active semiconductor film are not melted by even half in the film thickness direction. Next, experiments have shown that lateral growth is considerably promoted when the pulsed laser beam energy density is able to melt a volume fraction of ⅔ or greater of the thickness of the irradiated semiconductor film. As a result, thin-film semiconductor devices which have such crystalline active semiconductor films display excellent electrical characteristics. Consequently, a better lower limit is the irradiation energy density which produces melting of a volume fraction of ⅔ or more of the thickness of the semiconductor film which is beneath the local heating system (the "⅔ melting energy density" ($E_{2/3}$)). There is also a maximum value for the appropriate irradiation energy density. If the laser beam energy density on the surface of the active semiconductor film is too high, the semiconductor film is ablated; and naturally it is necessary to keep the energy density less than the value at which ablation (abrasion) occurs (the irradiation energy density for ablation is referred to as the "ablation energy density" ($E_{Ab}$) in the present patent disclosure). This value is the absolute maximum. Further, even when ablation does not occur across the entire surface, localized ablation of the active semiconductor layer can occur easily if the active semiconductor film on the local heating system is completely melted over the entire thickness (this irradiation energy density is referred to as the "complete melting energy" ($E_{CM}$) in the present patent disclosure). Because these areas lead to defects during the production of thin-film semiconductor devices and therefore result in yield losses, they are obviously not desirable. Consequently, for the production of high quality thin-film semiconductor devices with high yields, a value of the pulsed laser beam energy density at the surface of the semiconductor which is slightly lower than the value for complete melting of the thickness of the semiconductor film ($E_{CM}$) is desirable. This value becomes the desirable upper limit for the appropriate irradiation energy density. Ultimately then, when promoting lateral growth by irradiating active semiconductor films composed mainly of silicon using a solid-state laser with a pulse oscillation wavelength between 370 nm and 710 nm, the preferred irradiation energy density of the solid-state laser on the active semiconductor film is greater than the ½ melting energy density ($E_{1/2}$) and less than the ablation energy density ($E_{Ab}$). Actually a more desirable value is greater than the ½ melting energy density ($E_{1/2}$)) and less than the complete melting energy density ($E_{CM}$), or greater than the ⅔ melting energy density ($E_{2/3}$) and less than the ablation energy density ($E_{Ab}$). Ideally, this value is greater than the ⅔ melting energy density (E2/3) and less than the complete melting energy density ($E_{CM}$). When the strength of the pulse laser irradiating the active semiconductor film on the local heating system is above ⅔ of the melting energy density (E2/3) and less that the complete melting energy density ($E_{CM}$), in the disclosure of this invention this is defined as where "the active semiconductor film on the local heating system is almost completely melted in the thickness direction". The ideal irradiation energy density is a strength where the active semiconductor film on the local heating system is almost completely melted in the thickness direction while the other active semiconductor film portions are not completely melted. Specifically, for the case of the second harmonic of the solid-state pulsed Nd:YAG laser and a semiconductor film thickness between about 30 nm and 70 nm for an active semiconductor film composed mainly of silicon formed on the underside dielectric film, the YAG 2ω pulsed laser beam irradiation energy density on the surface of the active semiconductor film on the local heating system is $E_{SM}$=100 mJ·cm$^{-2}$ $E_{CM}$=625 mJ·cm$^{-2}$ $E_{Ab}$=950 mJ·cm$^{-2}$ and the irradiation energy density for melting a volume fraction of half of the thickness of the active semiconductor film on the local heating system is $E_{1/2}$=350 mJ·cm$^{-2}$.

Moreover, the irradiation energy density for melting a volume fraction of ⅔ of the thickness of the active semiconductor film on the local heating system is $E_{2/3}$=450 mJ·cm$^{-2}$.

Therefore, the desirable irradiation energy density for the YAG 2ω on the active semiconductor film on the local heating system is greater than 350 mJ·cm$^{-2}$ and less than 950 mJ·cm$^{-2}$. A more desirable value is greater than 450 mJ·cm$^{-2}$ and less than 950 mJ·cm$^{-2}$ or is greater than 350 mJ·cm$^{-2}$ and less than 625 mJ·cm$^{-2}$, and ideally, the value will be greater than 450 mJ·cm$^{-2}$ and less than 625 mJ·cm$^2$.

Figure 6A:
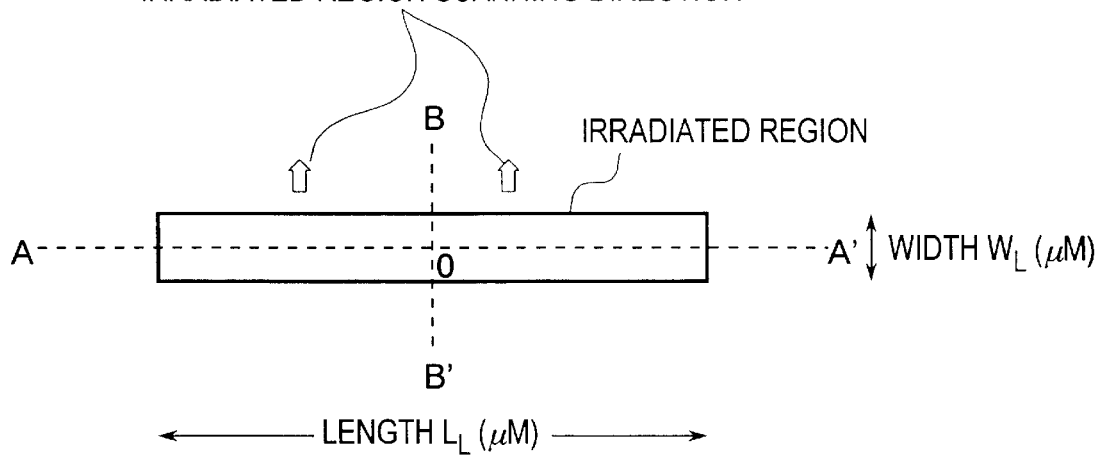
FIG. 6 is a diagram for explaining a laser beam radiation profile.
Figure 6B:
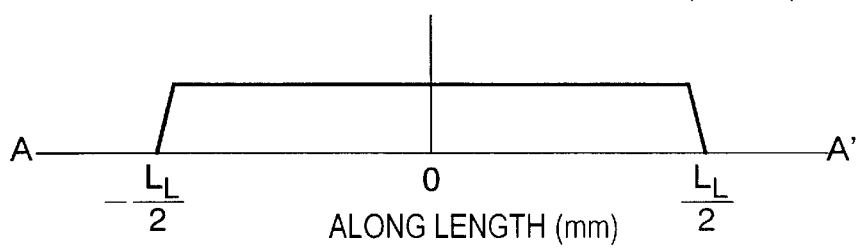
Figure 8A:
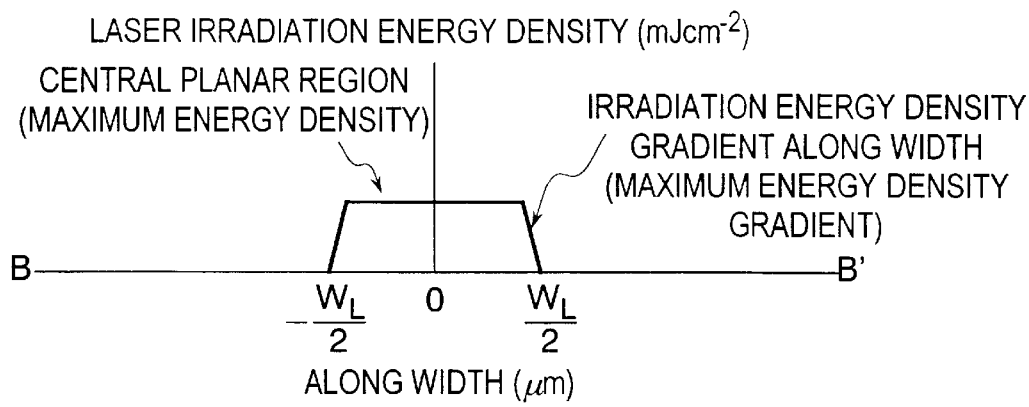
FIG. 8 is a diagram for explaining a laser beam radiation profile of the present invention.
Figure 8B:
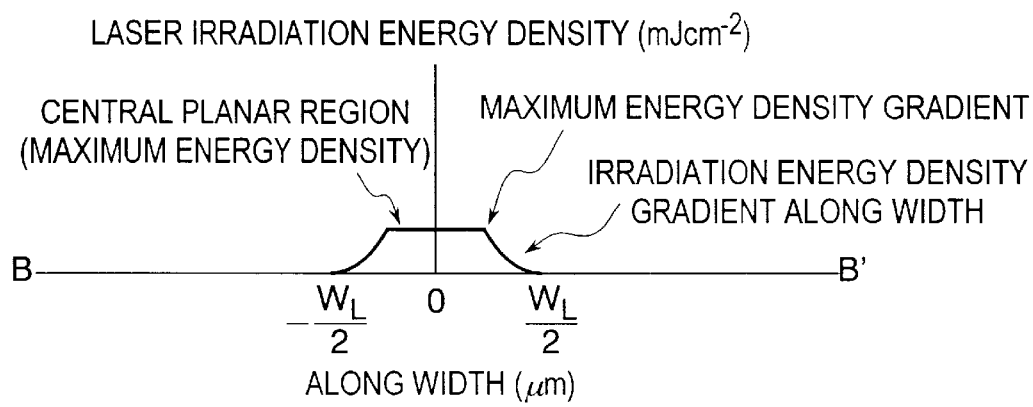

The irradiation region on the active semiconductor film at the time of irradiating the pulsed laser beam on the active semiconductor film in the crystallization process assumes a linear or essentially rectangular profile with a width $W_L$ (μm) and length $L_L$ (mm) (FIG. 6A). The laser irradiation energy density along a lengthwise cross-section of the irradiation region (cross-section A–A' in FIG. 6A) is essentially uniformly distributed (FIG. 6B) except at the edges of the irradiation region (near $\pm L_L/2$ in FIG. 6B). Specifically, except for 5% at the left and right edges respectively along the length, the energy density variation (the ratio of the standard deviation with respect to the mean) within the central 90% is less than about 5%. On the other hand, the laser irradiation energy density along a widthwise, or lateral, cross-section of the irradiation region (cross-section B–B' in FIG. 6A) is essentially a trapezoid (FIG. 7A) or a Gaussian profile (FIG. 7B). When the lateral cross-section is Gaussian, this means not only that the laser intensity in the lateral direction (FIG. 7B) actually assumes a profile approximating a Gaussian distribution, but also that the intensity decreases smoothly from the center (the 0 point in FIG. 7B) to the edge regions (the areas near $\pm W_L/2$ in FIG. 7B) as a differentiable function. When the lateral cross-section has a trapezoidal profile (FIG. 7A), it is desirable for the central flat region which has a variation in the energy density distribution of less than about 5% to account for from 30% to 90% of the total profile, which means that the upper and lower edge regions (near $\pm W_L/2$ in FIG. 7A) each account for between 5% and 35%. For example, if width $W_L$=100 μm, it is desirable for the central flat region to be from 30 μm to 90 μm and each of the upper and lower edge regions to be from 5 μm to 35 μm. To effectively reduce the number of defects in the active semiconductor layer and to promote lateral growth also optically, it is desirable that the position at which the maximum value of the widthwise irradiated energy density gradient is achieved and the position at which the maximum value of lateral irradiation energy density is achieved are essentially coincident. This is because complete melting occurs where the irradiated energy density is at the maximum position and, if the irradiated energy density gradient in that place is at the maximum, the crystal grains grow in the lateral direction along the irradiated energy density gradient. The widthwise cross-section that can be said to be ideal in the present invention is a laser beam intensity distribution that is either trapezoidal (FIG. 8A) or has the profile of Japan's Mt. Fuji (a trapezoid with concave sides) (FIG. 8B).

To effect lateral growth not only structurally but also optically when the active semiconductor film has been completely melted, in addition to the suppression of structural grain growth in the direction of the film thickness by means of the choice of the laser source and the matching active semiconductor film thickness, control of optical crystal growth in the horizontal direction is also important. Specifically, through the optimization of the ratio ($L_L/W_L$) of the length $L_L$ (abbreviated as the "irradiation length") of the linear or rectangular laser beam irradiation region to the width $W_L$ of the same region (abbreviated as the "irradiation width") as well as the irradiation region scanning scheme, it is possible to even further promote grain growth in the desired direction. First assume an irradiation length to irradiation width ratio ($L_L/W_L$) of 100 or higher. If the ($L_L/W_L$) ratio is higher than about 100, with each laser shot, the temperature gradient along the irradiation length is essentially non-existent and most of the gradient exists in the lateral direction (direction B–B' in FIG. 6A). As a result, the grains exhibit one-dimensional lateral growth along the width of the irradiation region. Because it is preferable to have the irradiation width $W_L$ between about 5 µm and 500 µm, a ratio ($L_L/W_L$) of 100 or higher, and ideally 1000 or higher is desirable from a throughput perspective. Next, the irradiation region with the profile described is translated in the lateral direction with each laser shot and the entire surface of the substrate is scanned. At this time, the width-wise direction of the irradiation region is made nearly coincident with the lengthwise direction of the local heating system, and the lengthwise direction of the irradiated region is made nearly coincident with the widthwise direction of the local heating system. Since the lengthwise direction of the local heating system and the lengthwise direction of the semiconductor device active region are coincident, and the widthwise direction of the local heating system and the widthwise direction of the semiconductor device active region are coincident, the widthwise direction of the irradiated region is nearly coincident with the lengthwise direction of the semiconductor device active region, and the lengthwise direction of the irradiated region is nearly coincident with the widthwise direction of the semiconductor device active region. As a result, the structural lateral growth direction which depends on the local heating system and the optical lateral growth direction which depends on the irradiation region shape coincide, so that the lateral growth distance in the active semiconductor film becomes increasingly larger. Consequently, by taking the direction of the active region of the thin-film semiconductor devices (the source—drain direction for MOSFETs and the emitter—collector direction for bipolar transistors) to be in the direction of the irradiation width, it is possible to easily realize superior thin-film semiconductor devices with either no grain boundaries that cross the electric current flow (FIG. 4), within the active region (within the MOSFET channel formation region, or the bipolar transistor emitter—base junction region, base region and the base—collector junction region), or even if grain boundaries that cross the electric current flow exist, these are always ones close to the center with respect to the lengthwise direction of the active region (FIG. 3). Moreover, so that the structural lateral growth is not obstructed by the irradiated region shape, even if the width $W_L$ of the irradiated region is small, this must be greater than the length of the local heating system $L_{HS}$ ($W_L/L_{HS}>1$), and the length of the irradiated region $L_L$ must be sufficiently greater than the width $W_{HS}$ of the local heating system ($L_L/W_{HS}>100$). The pulsed laser beam is gradually shifted in the widthwise direction of the irradiated region on the active semiconductor film, for each pulse of the irradiated region, to thereby complete irradiation of the entire substrate surface.

In promoting the lateral growth of the crystal grain in this manner, it is important to combine the structural means that establishes the local heating system, and the optical means that adjusts the type of light and the form thereof. One optically additional important factor in effecting one dimensional lateral growth of grains along the width during complete melting of active semiconductor films is the gradient of the laser energy density along the width of the irradiation region (abbreviated as the "energy density gradient."). The grain growth speed u(x) during melt crystallization is proportional to the semiconductor film temperature gradient dT(x)/dx $$u(x)=k \cdot dT(x)/dx \qquad \text{(Equation 1)}$$

in which k is the speed constant, and T(x) is the semiconductor film temperature at a location x on the semiconductor film. Letting the melting time for the semiconductor film be $t_m$, the grain growth size $L_c$ is given by the product of the grain growth speed and the melting time $t_m$ $$L_c = u \cdot t_m = k \cdot dT/dx \cdot t_m \qquad \text{(Equation 2).}$$

Because the speed constant k is fixed and the melting time is also essentially constant, the grain growth size is proportional to the semiconductor film temperature gradient. On the other hand, because the semiconductor film temperature is proportional to the irradiation pulsed laser beam energy density, the grain growth size $L_c$ is ultimately proportional to the energy density gradient dE/dx $$L_c \, dE/dx \qquad \text{(Equation 3).}$$

For the grain growth size to increase, a large energy density gradient is necessary. According to the experimental results of the inventor and others, during complete melt crystallization of semiconductor films on glass substrates using the YAG 2ω as the pulsed laser source, the grain growth size along the irradiation width was larger than 1 µm when the maximum value of the energy density gradient was larger than about 3 mJ·cm$^{-2}$·µm$^{-1}$, being between about 3.0 mJ·cm$^{-2}$·µm$^{-1}$ and 4.0 mJ·cm$^{-2}$·µm$^{-1}$. Further, when the maximum value of the energy density gradient was between 10 mJ·cm$^{-2}$·µm$^{-1}$ and 20 J·cm$^{-2}$·µm$^{-1}$ the grain growth size along the irradiation width was larger than 2 µm. Also, when the maximum value of the energy density gradient was about 30 mJ·cm$^{-2}$·µm$^{-1}$, the grain growth size along the irradiation width was about 3 µm. Therefore, in order to have significant lateral growth of the crystal in the active semiconductor layer portion on the local heating system and hence produce excellent thin-film semiconductor devices, it is desirable that the widthwise direction of the irradiation region nearly coincides with the lengthwise direction of the local heating system, and in addition that the maximum value of the energy density gradient is greater than about 3 mJ·cm$^{-2}$·µm$^{-1}$. If the maximum value of the energy density gradient is between 10 mJ·cm$^{-2}$·µm$^{-1}$ and 20 J·cm$^{-2}$·µm$^{-1}$, this is even more desirable, and ideally this should be greater than about 30 mJ·cm$^{-2}$·µm$^{-1}$.

In fabrication of high quality thin-film semiconductor devices, it is also necessary to optimize the number of times a given location on the active semiconductor film is irradiated by a pulsed laser beam (abbreviated as the "number of laser shots"). The minimum number of laser shots is one, and the maximum number is approximately 40. If irradiation is repeated approximately 40 times or more, the active semiconductor layer on the local heating system may be damaged. If films of this type are used to fabricate thin-film semiconductor devices, the semiconductor devices are completely non-functional as a result of problems such as gate leakage. In order to fabricate high quality thin-film semiconductor devices while growing grains laterally at a required location on an active semiconductor layer, and also maintaining a planar semiconductor film surface, a region irradiated by a pulsed laser should be scanned such that the number of laser shots is between approximately one and approximately forty.

When the present invention is applied to a liquid crystal display device, it is preferable that its substrate is transparent to visible light, and in other applications it is desirable that the substrate is essentially transparent to at least a pulsed laser beam. Specifically, a desirable condition is that the absorption coefficient of a substrate to a pulsed laser beam is approximately one hundredth or less of the absorption coefficient of polysilicon. This is based on a principle of the present invention that in the present invention, a local heating system absorbs light passing through an active semiconductor layer, the active semiconductor layer is locally heated, and melt crystallization proceeds. This is because, if the substrate is made of a material that absorbs a pulsed laser beam, the mechanism by which the active semiconductor layer is locally heated does not function. If the absorption coefficient of the substrate is approximately one hundredth or less of the absorption coefficient of the local heating system, only the active semiconductor layer on the local heating system is selectively heated, thus enabling the formation of laterally grown grains on the region.

As has been described in detail above, the present invention makes it possible to control grain location, and further, increase the size of grains formed as well as make the distribution uniform, by providing a local heating system on a polycrystalline semiconductor film that conventionally cannot control grains because of its low quality, and by using a specific type of light for irradiation in a crystallization process As a result there are effects that the electrical characteristics of thin-film semiconductor devices exemplified by thin-film transistors can be markedly improved, and at the same time, variations can be minimized, the thin-film semiconductor devices can be made to operate at high speeds and low voltages, and furthermore such thin-film semiconductor devices can be produced reliably.

Practical examples of this invention will be described with reference to the accompanying figures.

EXAMPLE 1

Figure 9A:
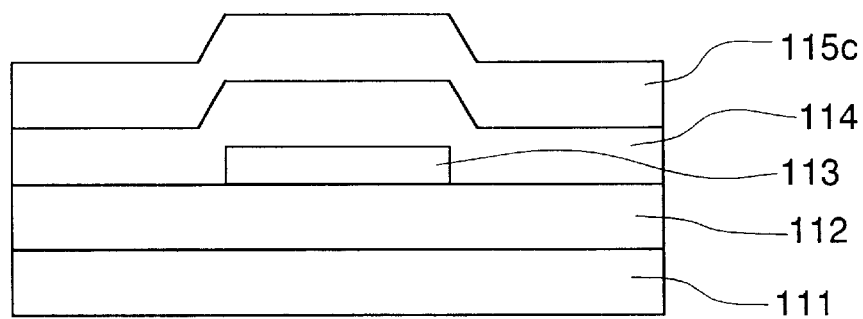
FIG. 9 is a diagram for explaining a fabrication process of the present invention.
Figure 9B:
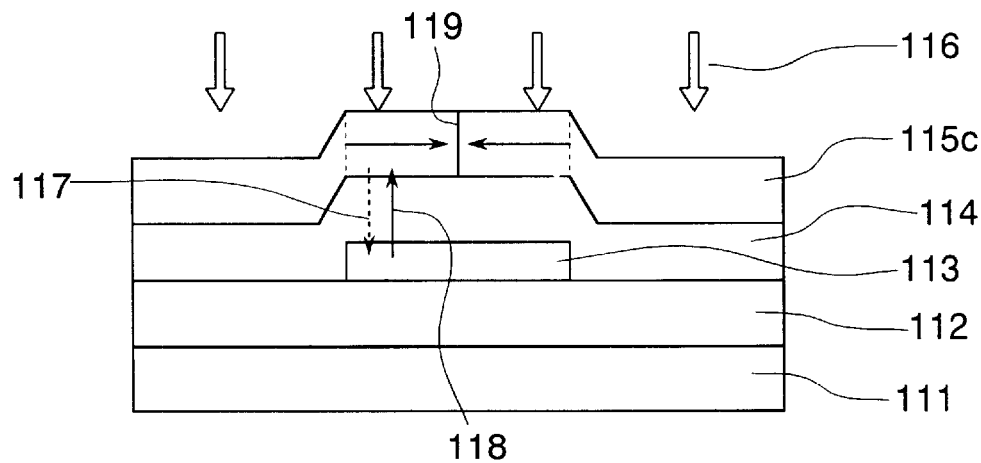
Figure 9C:
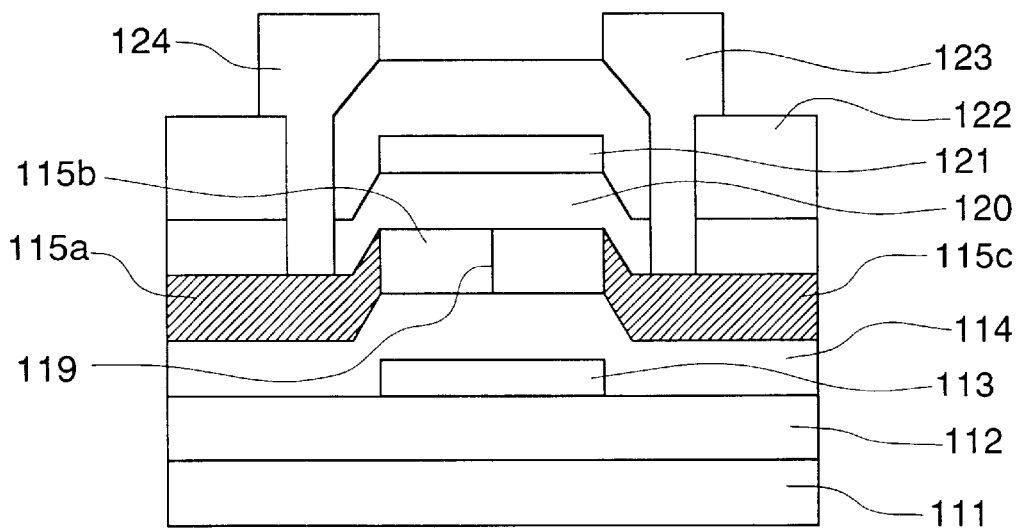

FIGS. 9A, 9B and 9C are diagrams of a process showing a first example of a thin-film semiconductor device fabrication method of the present invention. Hereunder, the fabrication method of a thin-film semiconductor device according to the present invention will be described in the order (1), (2), (3) with reference to the figures.

(1) Process in FIG. 9A

A thin-film semiconductor device is fabricated on a substrate. For the substrate, a quartz substrate 111 1.1 mm thick is used, and on this quartz substrate 111, a silicon oxide layer 112 approximately 200 nm thick is deposited as an underlevel protection layer by electron cyclotron resonance plasma chemical vapor deposition (ECR-PECVD). Then, on the silicon oxide layer 112 serving as the underlevel protection layer, an amorphous silicon layer approximately 50 nm thick is deposited by low pressure chemical vapor deposition (LPCVD), and afterwards the amorphous silicon layer is patterned by photolithography to produce a first semiconductor layer 113. The length of the first semiconductor layer is about 1 $\mu$m longer than the length of the semiconductor device active region, and the semiconductor device active region is located in the central area in the lengthwise direction of the first semiconductor layer. Furthermore, the width of the first semiconductor layer is approximately 50 $\mu$m, and the semiconductor device active region is completely contained within the first semiconductor layer in the widthwise direction. On the first semiconductor layer 113, a silicon oxide layer 114 approximately 160 nm thick is deposited as an underside dielectric layer by ECR-PECVD. Then, on the silicon oxide layer 114 serving as the underside dielectric layer, an amorphous silicon layer approximately 50 nm thick is deposited as an active semiconductor layer 115 by LPCVD, and afterwards heat treatment is applied for 48 hours at 600° C. in a nitrogen atmosphere, and the crystallization of the active semiconductor layer 115 is refined by a solid phase crystallization method. Furthermore, a xenon chlorine (XeCl) excimer laser (wavelength: 308 nm) irradiates a large grain size polysilicon film serving as the active semiconductor layer 115, reducing internal defects of the grains in the active silicon layer.

(2) Process in FIG. 9B

Next, a laser (YAG2$\omega$ laser, wavelength 532 nm) beam 116, which uses the second harmonic of a laser (YAG laser, wavelength 1064 nm) whose host crystal is made by doping Nd$^{3+}$ ion onto Yttrium Aluminum Garnet, irradiates the polysilicon film 115 side serving as an active semiconductor layer. The irradiated region of the YAG2$\omega$ beam is a rectangular shape 15 mm long and 65 $\mu$m wide, and exhibits a Gaussian intensity distribution in the widthwise direction. During irradiation, the lengthwise direction of the YAG2$\omega$ beam and the widthwise direction of the first semiconductor layer are aligned as closely as possible. Accordingly, the direction of travel in the irradiated region and the source-drain direction of the thin-film semiconductor device are almost parallel. The irradiating energy density of the YAG2$\omega$ laser beam is 450 mJ cm$^{-2}$, and any given point on the active semiconductor layer is subjected to pulsed laser irradiation 20 times. If a YAG2$\omega$ laser is radiated, a proportion of the YAG2$\omega$ laser beam 116 is absorbed by the polysilicon film 115 serving as an active semiconductor layer. However, a proportion of the YAG2$\omega$ laser beam 116 is not absorbed by the polysilicon film 115 serving as an active semiconductor layer and passes through it. A YAG2$\omega$ laser beam 117 that has passed through the polysilicon film 115, after reflection and interference by the silicon oxide layer 114 serving as the underside dielectric layer, is absorbed by the first semiconductor layer 113. The temperature of the first semiconductor layer 113 increases by absorption of the YAG2$\omega$ laser beam 117. Heat 118 emitted from this first semiconductor layer 113 influences the active semiconductor layer 115, so that the temperature of the active semiconductor layer immediately on top of the first semiconductor layer 113 rises higher than the temperature of the parts of the active semiconductor layer other than that immediately on top of the first semiconductor layer. By the temperature difference within the active semiconductor layer 115 thus produced, grain growth of the active semiconductor layer is generated in a lateral direction from the low temperature region (the part of the active semiconductor layer other than that immediately on top of the first semiconductor layer 113) to the high temperature region (the active semiconductor layer immediately on top of the first semiconductor layer 113). Finally, the two grains collide at the center right of the first semiconductor layer, and a grain boundary 119 occurs in a direction perpendicular to the lateral growth direction of the grains thereon. The size of the lateral growth is typically between approximately 2 $\mu$m and 2.5 $\mu$m, and about 3.5 $\mu$m at a maximum.

(3) Process in FIG. 9C

After crystallization of the active semiconductor layer 115 by the YAG2$\omega$ laser beam 116, a silicon oxide film 120 of the order of 60 nm is deposited on top of the active semiconductor layer 115 as a gate dielectric layer by ECR-PECVD. On the silicon oxide film 120 serving as a gate dielectric layer, a tantalum nitride (TaN) film of the order of 50 nm is deposited, and a tantalum (Ta) film of the order of 450 nm is deposited. Afterwards, the abovementioned TaN film and Ta film are patterned by photolithography such that they are almost identical to the pattern of the first semiconductor layer 113, forming a gate electrode 121. Next, using the abovementioned gate electrode 121 as a mask, donor or acceptor impurity ions are implanted in order to form source and drain regions 115a and 115c, and a channel formation region 115b by a self-aligning method. At this time, the source and drain regions are formed such that carriers move along the lateral growth of the grains of the active semiconductor layer. Then, in order to activate the impurity elements residing in the source and drain regions, heat treatment is provided in a nitrogen atmosphere at 300° C. for four hours. Afterwards, as an interlevel dielectric layer 122, a silicon oxide layer of the order of 500 nm is deposited by plasma CVD (PECVD) using TEOS (Si—(OCH$_2$CH$_3$)$_4$) and oxygen as the source gases. Finally, after contact holes are opened by photolithography, aluminum (Al) is deposited by a sputtering technique, the Al is patterned by photolithography, forming source and drain electrodes 123 and 124, and the semiconductor device is completed.

Figure 10:
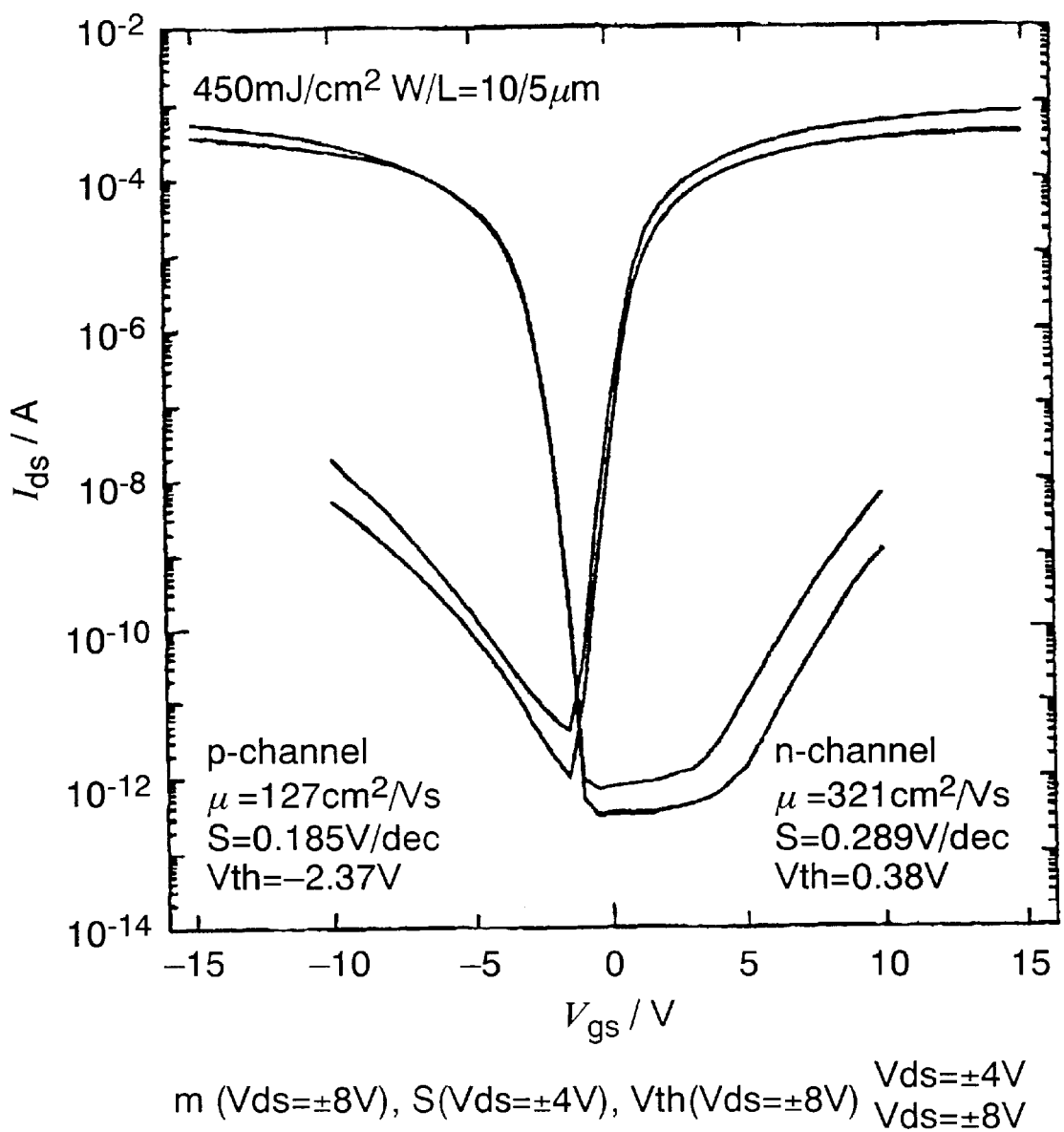
FIG. 10 is a diagram for explaining an effect of the present invention.

Transfer characteristics of thin-film semiconductor devices fabricated in this manner have been measured. An example of the transfer characteristics of a thin-film semiconductor device according to the present invention is shown in FIG. 10. Additionally, transfer characteristics of thin-film semiconductor devices having a channel formation region whose length L is 10 μm and width W is 10 μm and a thin-film semiconductor device having L of 5 μm and W of 10 μm were also measured. As a comparative example exemplifying a prior art, the transfer characteristics of a thin-film semiconductor device that was not irradiated by a YAG2ω laser beam, and whose grains of the active semiconductor layer were not grown laterally, were similarly measured. Measurement results are shown in Table 1. As shown in FIG. 10 and Table 1, the present invention makes it possible to fabricate a semiconductor device having excellent electrical characteristics that exhibits steep sub threshold characteristics with high carrier mobility. This proves that in the present invention, an active semiconductor layer serving as a channel formation region comprises laterally grown large grains in a columnar shape. Furthermore, the transfer characteristics of a semiconductor device of L 5 μm, fabricated by the present invention, are superior to the transfer characteristics of a semiconductor device of L 10 μm. This is because by shortening L, there is only one grain boundary (grain boundary crossing the electric current flow) in a direction perpendicular to the direction of movement of the carriers existing inside the channel formation region in the central part of the channel formation region, and the movement of the carriers is hence eased. Moreover, since the location of grain boundaries inside the channel formation region is controlled in the central part of the channel formation region, non-uniformity of the electrical characteristics of semiconductor devices is reduced. As described above, in the first example of the present invention, a channel formation region of a semiconductor layer comprises large grains, the location of grain boundaries is controlled in a direction perpendicular to the direction of movement of the carriers, and hence thin-film semiconductor devices with good electric characteristics and less non-uniformity are fabricated.

TABLE 1

| | NMOS | PMOS |
|---|---|---|
| (a) Transfer Characteristics of Semiconductor Device Produced by Fabrication Method of the Present Invention W/L = 10/10 μm | | |
| Mobility (cm$^2$ V$^{-1}$ s$^{-1}$) | 219 | 122 |
| Threshold Voltage (V) | 0.15 | −2.22 |
| Sub Threshold Swing (V) | 0.262 | 0.180 |
| (b) Transfer Characteristics of Semiconductor Device Produced by Fabrication Method of the Present Invention W/L = 10/5 μm | | |
| Mobility (cm$^2$ V$^{-1}$ s$^{-1}$) | 321 | 144 |
| Threshold Voltage (V) | 0.38 | −2.22 |
| Sub Threshold Swing (V) | 0.269 | 0.171 |
| (c) Transfer Characteristics of Semiconductor Device with no YAG2ω Laser Beam Irradiation W/L = 10/10 μm | | |
| Mobility (cm$^2$ V$^{-1}$ s$^{-1}$) | 89 | 62 |
| Threshold Voltage (V) | −0.59 | −3.11 |
| Sub Threshold Swing (V) | 0.345 | 0.286 |
| (d) Transfer Characteristics of Semiconductor Device with no YAG2ω Laser Beam Irradiation W/L = 10/5 μm | | |
| Mobility (cm$^2$ V$^{-1}$ s$^{-1}$) | 100 | 52 |
| Threshold Voltage (V) | −0.60 | 0.288 |
| Sub Threshold Swing (V) | 0.393 | −3.36 |

EXAMPLE 2

Figure 11A:
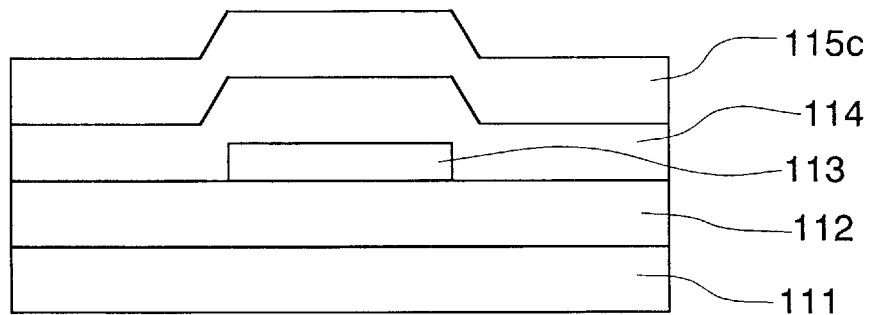
FIG. 11 is a diagram for explaining a fabrication process of the present invention.
Figure 11B:
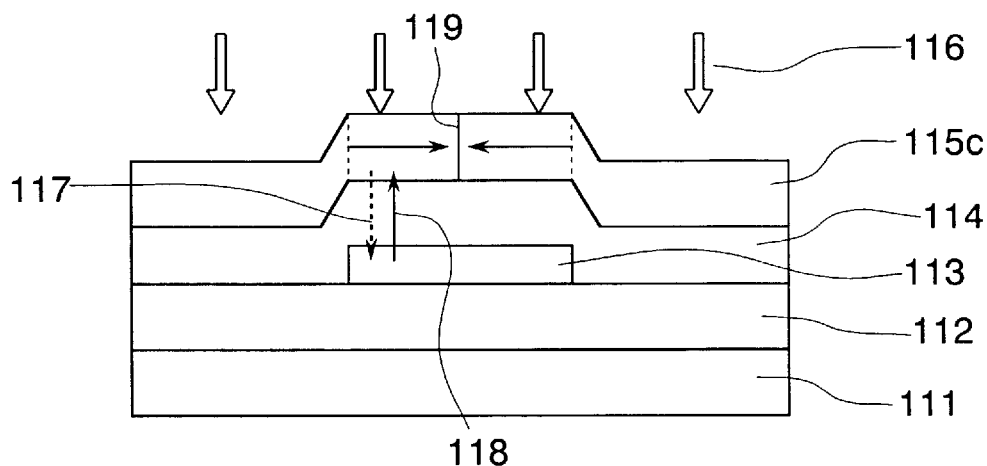
Figure 11C:
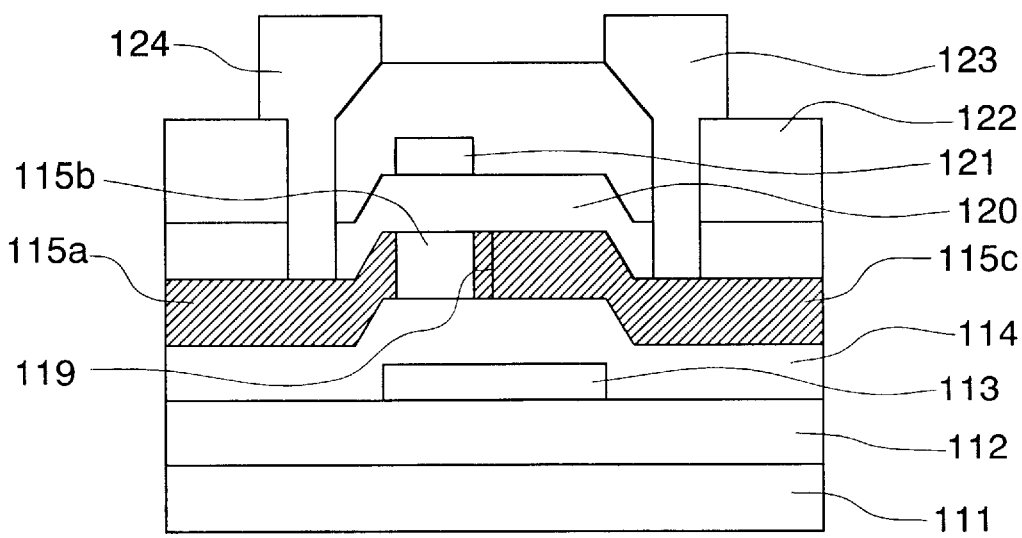

FIGS. 11A, 11B and 11C are diagrams of a process showing a second example of a thin-film semiconductor device fabrication method of the present invention. Hereunder, the fabrication method of a thin-film semiconductor device according to the present invention will be described in the order (1), (2), (3) with reference to the figures.

(1) Process in FIG. 11A

This is similar to the process in FIG. 9A of Example 1. For a substrate, a quartz substrate 211 1.1 mm thick is used, and on the quartz substrate 211, a silicon oxide layer 212 approximately 200 nm thick is deposited as an underlevel protection layer by electron cyclotron resonance plasma chemical vapor deposition (ECR-PECVD). On the silicon oxide layer 212 serving as the underlevel protection layer, an amorphous silicon layer approximately 50 nm thick is deposited by low pressure chemical vapor deposition (LPCVD), and afterwards the amorphous silicon layer is patterned by photolithography to produce a first semiconductor layer 213. The length of the first semiconductor layer is about 2 μm longer than twice the length of the semiconductor device active region to be formed later, and also the amorphous silicon layer is patterned such that the semiconductor device active region is located avoiding the central area in the lengthwise direction of the first semiconductor layer, and at the same time, is completely contained within the first semiconductor layer. Furthermore, the amorphous silicon layer is patterned such that the width of the first semiconductor layer is approximately several μm or more larger than the width of the semiconductor device active region, and the semiconductor device active region is completely contained within the first semiconductor layer in the widthwise direction. On the first semiconductor layer 213, a silicon oxide layer 214 approximately 160 nm thick is deposited as an underside dielectric layer by ECR-PECVD. Then, on the silicon oxide layer 214 serving as the underside dielectric layer, an amorphous silicon layer approximately 50 nm thick is deposited as an active semiconductor layer 215 by LPCVD, and afterwards heat treatment is applied for 48 hours at 600° C. in a nitrogen atmosphere, and the crystallization of the active semiconductor layer 115 is refined by a solid phase crystallization method. Furthermore, a xenon chloride (XeCl) excimer laser (wavelength: 308 nm) irradiates the active semiconductor layer 215 to which the solid phase crystallization process is applied, reducing internal defects of the grains in the polysilicon layer.

(2) Process in FIG. 11B

This is similar to the process in FIG. 9B of Example 1. A laser (YAG2ω laser, wavelength 532 nm) beam 216, which uses the second harmonic of a laser (YAG laser, wavelength 1064 rim) whose host crystal is made by doping $Nd^{3+}$ ion onto Yttrium Aluminum Garnet, irradiates the polysilicon film 215 side serving as an active semiconductor layer. The irradiated region of the YAG2ω beam is a rectangular shape 15 mm long and 65 μm wide, and exhibits a Gaussian intensity distribution in the widthwise direction. During irradiation, the lengthwise direction of the YAG2ω beam and the widthwise direction of the first semiconductor layer are aligned as closely as possible. Accordingly, the direction of travel in the irradiated region and the source-drain direction of the thin-film semiconductor device are almost parallel. The irradiating energy density of the YAG2ω laser beam is 450 mJ $cm^{-2}$, and any given point on the active semiconductor layer is subjected to pulsed laser irradiation 20 times. If a YAG2ω laser is radiated, a proportion of the YAG2ω laser beam 216 is absorbed by the polysilicon film 215 serving as an active semiconductor layer. However, the other proportion of the YAG2ω laser beam 216 is not absorbed by the polysilicon film 215 serving as an active semiconductor layer and passes through it. A YAG2ω laser beam 217 that has passed through the polysilicon film 215, after reflection and interference by the silicon oxide layer 214 serving as the underside dielectric layer, is absorbed into the first semiconductor layer 213. The temperature of the first semiconductor layer 213 increases by absorption of the YAG2ω laser beam 217. Heat 218 emitted from this first semiconductor layer 213 influences the active semiconductor layer 215, so that the temperature of the active semiconductor layer immediately on top of the first semiconductor layer 213 rises higher than the temperature of the parts of the active semiconductor layer other than that immediately on top of the first semiconductor layer. By this temperature difference within the active semiconductor layer 215, grain growth of the active semiconductor layer is generated in a lateral direction from the low temperature region (the part of the active semiconductor layer other than that immediately on top of the first semiconductor layer 213) to the high temperature region (the active semiconductor layer immediately on top of the first semiconductor layer 213). Finally, the two grains collide at the center right of the first semiconductor layer, and a grain boundary 219 is formed in a direction perpendicular to the lateral growth direction of the grains thereon. The size of the lateral growth is between approximately 2 μm and 2.5 μm, and about 3.5 μm at a maximum.

(3) Process in FIG. 11C

After crystallization of the active semiconductor layer 215 by the YAG2ω laser beam 216, a silicon oxide film 220 of the order of 60 nm is deposited on top of the active semiconductor layer 215 as a gate dielectric layer by ECR-PECVD. On the silicon oxide film 220 serving as a gate dielectric layer, a tantalum nitride (TaN) film of the order of 50 nm is deposited, and a tantalum (Ta) film of the order of 450 nm is deposited. Afterwards, the abovementioned TaN film and Ta film are patterned by photolithography, forming a gate electrode 221. During this patterning, the gate electrode 221 is formed such that a grain boundary 219 in a direction perpendicular to the lateral growth direction of grains is not contained within the active semiconductor layer immediately under the gate electrode 221 serving as the semiconductor active region. Next, using the abovementioned gate electrode 221 as a mask, donor or acceptor impurity ions are implanted in order to form source and drain regions 215a and 215c, and a channel formation region 215b by a self-aligning method. At this time, the source and drain regions are formed such that carriers move along the lateral growth of the grains of the active semiconductor layer. Then, in order to activate the impurity elements residing in the source and drain regions, heat treatment is provided in a nitrogen atmosphere at 300° C. for four hours. Afterwards, as an interlevel dielectric layer, a silicon oxide layer of the order of 500 nm is deposited by plasma CVD (PECVD) using TEOS ($Si$—$(OCH_2CH_3)_4$) and oxygen as the source gases. Finally, after contact holes are opened by photolithography, aluminum (Al) is deposited by a sputtering technique, the Al is patterned by photolithography, forming source and drain electrodes 223 and 224, and the semiconductor device is completed. As described above, according to the present second example, there is no grain boundary in a direction perpendicular to the direction of carrier movement in an active semiconductor layer immediately under a gate electrode serving as a channel formation region of a semiconductor device, and hence it is possible to fabricate a high quality semiconductor device on the same level with a single crystal semiconductor device.

What is claimed is:

1. A method of fabricating a thin-film semiconductor device, comprising processes of:

providing a heating system on a substrate, the heating system being formed in island shape;

forming an active semiconductor layer over said heating system;

heating said heating system, whereby said heating system locally overheats said active semiconductor layer so as to crystallize said active semiconductor layer; and patterning said crystallized active semiconductor layer, which forms an active region of said semiconductor layer into insular shape.

2. A method of fabricating a thin-film semiconductor device according to claim 1, wherein when a length of said finished semiconductor device active region is L (μm), the length L (μm) of said semiconductor device active region is processed to be shorter than a length $L_{HS}$ (μm) of said local heating system (L<$L_{HS}$).

3. A method of fabricating a thin-film semiconductor device according to claim 2, wherein in said element patterning process;

said active semiconductor layer is processed such that said semiconductor device active region is contained within said local heating system in a lengthwise direction.

4. A method of fabricating a thin-film semiconductor device according to claim 1, wherein in said heating system providing process;

a length $L_{HS}$ (μm) of said local heating system is made approximately 7 μm or less ($L_{HS}$<7 μm).

5. A method of fabricating a thin-film semiconductor device according to claim 1, wherein in said crystallized active semiconductor layer patterning process;

said active semiconductor layer is processed such that a length of said semiconductor device active region L (μm) is approximately half a length $L_{HS}$ (μm) of said local heating system or less (L<$L_{HS}$/2).

6. A method of fabricating a thin-film semiconductor device according to claim 5, wherein in said crystallized active semiconductor layer patterning process, said active semiconductor layer is processed such that said semiconductor device active region is completely contained within said local heating system in the lengthwise direction, and does not include the central area in the lengthwise direction of said local heating system.

7. A method of fabricating a thin-film semiconductor device according to claim 1, wherein when a width of said semiconductor device active region is W (μm), in said element separation process the width W (μm) of said active region is made to be shorter than a width $W_{HS}$ (μm) of said local heating system (W<$W_{HS}$).

8. A method of fabricating a thin-film semiconductor device according to claim 7, wherein when the width of said semiconductor device active region is W (μm), in said element separation process the width W (μm) of said active region is made to be shorter than the width $W_{HS}$ (μm) of said local heating system by at least approximately 6 μm (W<$W_{HS}$−6 μm).

9. A method of fabricating a thin-film semiconductor device according to claim 7, wherein in said element separation process, said active semiconductor layer is processed such that said semiconductor device active region is contained within said local heating system in the widthwise direction.

10. A method of fabricating a thin-film semiconductor device according to claim 7, wherein in said element separation process, said active semiconductor layer is processed such that edges in the lengthwise direction of said semiconductor device active region are located approximately 1.5 μm or more inside the edges in the lengthwise direction of said local heating system.

11. A method of fabricating a thin-film semiconductor device according to claim 1, wherein said heating system formation process, involves:

a first semiconductor layer deposition process for depositing a first semiconductor layer on the substrate, a first semiconductor layer fabrication process for fabricating said first semiconductor layer into a predetermined shape, and an underside dielectric film formation process for forming an underside dielectric film on said first semiconductor layer.

12. A method of fabricating a thin-film semiconductor device according to claim 11, wherein a thickness of said first semiconductor layer is between approximately 25 nm and approximately 100 nm.

13. A method of fabricating a thin-film semiconductor device according to claim 11, wherein a thickness of said first semiconductor layer is between approximately 30 nm and approximately 70 nm.

14. A method of fabricating a thin-film semiconductor device according to claim 11, wherein said first semiconductor layer is a semiconductor layer comprised mainly of silicon.

15. A method of fabricating a thin-film semiconductor device according to claim 11, wherein a thickness of said underside dielectric film is between approximately 130 nm and approximately 180 nm.

16. A method of fabricating a thin-film semiconductor device according to claim 11, wherein a thickness of said active semiconductor layer is between approximately 30 nm and approximately 70 nm.

17. A method of fabricating a thin-film semiconductor device according to claim 1, wherein said active semiconductor layer formation process includes an amorphous semiconductor layer deposition process for depositing an amorphous semiconductor layer.

18. A method of fabricating a thin-film semiconductor device according to claim 1, wherein said active semiconductor layer formation process includes:

an amorphous semiconductor layer deposition process for depositing an amorphous semiconductor layer, and a semiconductor layer refinement process for enhancing the crystallization of said amorphous semiconductor layer.

19. A method of fabricating a thin-film semiconductor device according to claim 18, wherein said semiconductor layer refinement process comprises a solid phase crystallization process for crystallizing said amorphous semiconductor layer in a solid state.

20. A method of fabricating a thin-film semiconductor device according to claim 18, wherein said semiconductor layer refinement process comprises a melt crystallization refinement process for refining the crystallization of said amorphous semiconductor layer by passing it through a melted condition.

21. A method of fabricating a thin-film semiconductor device according to claim 18, wherein said semiconductor layer refinement process comprises;

a solid phase crystallization process for crystallizing said amorphous semiconductor layer in a solid state, and a melt crystallization refinement process for refining the crystallization of said solid phase crystallized semiconductor layer by passing it through a melted condition.

22. A method of fabricating a thin-film semiconductor device according to claim 1, wherein said active semiconductor layer is a semiconductor layer comprised mainly of silicon.

23. A method of fabricating a thin-film semiconductor device according to claim 1, wherein said crystallization process involves irradiating light having an absorption coefficient in a polysilicon film of between approximately $2 \times 10^{-4}$ nm$^{-1}$ and approximately $1 \times 10^{-1}$ nm$^{-1}$ onto said active semiconductor layer side, to promote melt crystallization of said active semiconductor layer.

24. A method of fabricating a thin-film semiconductor device according to claim 23, wherein when a thickness of said active semiconductor layer is x (nm), and an absorption coefficient of light radiated during said crystallization process in the polysilicon film is $\mu_{p\text{-}Si}$ (nm$^{-1}$), the thickness x (nm) and the absorption coefficient $\mu_{p\text{-}Si}$ (nm$^{-1}$) satisfy the relationship:

$$0.105 < x \times \mu_{p\text{-}Si} < 1.609.$$

25. A method of fabricating a thin-film semiconductor device according to claim 23, wherein when a thickness of said active semiconductor layer is x (nm), and an absorption coefficient of light radiated during said crystallization process in the polysilicon film is $\mu_{p\text{-}Si}$ (nm$^{-1}$), the thickness x (nm) and the absorption coefficient $\mu_{p\text{-}Si}$ (nm$^{-1}$) satisfy the relationship:

$$0.105 < x \times \mu_{p\text{-}Si} < 0.693.$$

26. A method of fabricating a thin-film semiconductor device according to claim 23, wherein when a thickness of said active semiconductor layer is x (nm), and an absorption coefficient of light radiated during said crystallization process in the polysilicon film is $\mu_{p\text{-}Si}$ (nm$^{-1}$), the thickness x (nm) and the absorption coefficient $\mu_{p\text{-}Si}$ (nm$^{-1}$) satisfy the relationship:

$$0.105 < x \times \mu_{p\text{-}Si} < 0.405.$$

27. A method of fabricating a thin-film semiconductor device according to claim 23, wherein the light irradiated in said crystallization process is a laser beam.

28. A method of fabricating a thin-film semiconductor device according to claim 27, wherein the light irradiated in said crystallization process is a pulsed laser beam.

29. A method of fabricating a thin-film semiconductor device according to claim 28, wherein said pulsed laser beam is a harmonic of a solid-state laser having Q-switch oscillation.

30. A method of fabricating a thin-film semiconductor device according to claim 28, wherein said pulsed laser beam is a harmonic of a solid-state laser having Q-switch oscillation with a lasing medium of crystals doped with Nd ions.

31. A method of fabricating a thin-film semiconductor device according to claim 28, wherein said pulsed laser beam is a second harmonic of a Q-switched oscillation Nd:YAG laser beam.

32. A method of fabricating a thin-film semiconductor device according to claim 28, wherein said pulsed laser beam is a second harmonic of a Q-switched oscillation Nd:YVO$_4$ laser beam.

33. A method of fabricating a thin-film semiconductor device according to claim 23, wherein the wavelength of the light irradiated in said crystallization process is between approximately 370 nm and approximately 710 nm.

34. A method of fabricating a thin-film semiconductor device according to claim 23, wherein the wavelength of the light irradiated in said crystallization process is between approximately 450 nm and 650 nm.

35. A method of fabricating a thin-film semiconductor device according to claim 23, wherein the wavelength of the light irradiated in said crystallization process is approximately 532 nm.

36. A method of fabricating a thin-film semiconductor device according to claim 1, wherein said heating system heating process involves irradiating light having an absorption coefficient in a polysilicon film of between approximately $1 \times 10^{-3}$ nm$^{-1}$ and approximately $1 \times 10^{-2}$ nm$^{-1}$ onto said active semiconductor layer side, to promote melt crystallization of said active semiconductor layer.

* * * * *

UNITED STATES PATENT AND TRADEMARK OFFICE
CERTIFICATE OF CORRECTION

PATENT NO.     : 6,602,765 B2
DATED          : August 5, 2003
INVENTOR(S)    : Hiroaki Jiroku et al.

It is certified that error appears in the above-identified patent and that said Letters Patent is hereby corrected as shown below:

<u>Title page,</u>
Item [73], Assignee, change "Seiko Epson Corporation" to -- Seiko Epson Corporation and Mitsubishi Denki Kabushiki Kaisha --

Signed and Sealed this

Twentieth Day of April, 2004

JON W. DUDAS
*Acting Director of the United States Patent and Trademark Office*